(12) United States Patent
Schellenberg et al.

(10) Patent No.: US 8,900,779 B2
(45) Date of Patent: Dec. 2, 2014

(54) COLOR FILTER COMPOSITION

(75) Inventors: Carsten Schellenberg, Basel (CH);
Clemens Auschra, Freiburg (DE);
Masaki Ohwa, Kobe (JP); Junichi Tanabe, Amagasaki (JP); Mamiko Takesue, Osaka (JP)

(73) Assignee: Ciba Corporation, Tarrytown, NY (US)

( * ) Notice: Subject to any disclaimer, the term of this patent is extended or adjusted under 35 U.S.C. 154(b) by 1124 days.

(21) Appl. No.: 12/309,089

(22) PCT Filed: Jul. 2, 2007

(86) PCT No.: PCT/EP2007/056622
§ 371 (c)(1),
(2), (4) Date: Jan. 6, 2009

(87) PCT Pub. No.: WO2008/006723
PCT Pub. Date: Jan. 17, 2008

(65) Prior Publication Data
US 2009/0186285 A1    Jul. 23, 2009

(30) Foreign Application Priority Data
Jul. 11, 2006   (EP) .................................. 06116964

(51) Int. Cl.
*G03F 7/20*    (2006.01)
*G02B 5/20*    (2006.01)

(52) U.S. Cl.
USPC ........................................................... 430/7

(58) Field of Classification Search
None
See application file for complete search history.

(56) References Cited

U.S. PATENT DOCUMENTS

| | | | |
|---|---|---|---|
| 5,412,047 A | 5/1995 | Georges et al. | 526/204 |
| 6,008,303 A | 12/1999 | Weingart et al. | 525/330.7 |
| 6,344,300 B1 * | 2/2002 | Baba et al. | 430/7 |
| 6,353,107 B1 | 3/2002 | Kramer et al. | 546/216 |
| 2004/0024130 A1 | 2/2004 | Nelson et al. | 525/242 |
| 2004/0082742 A1 | 4/2004 | Nesvadba et al. | 526/217 |
| 2004/0143035 A1 | 7/2004 | Goebelt et al. | 523/200 |
| 2006/0160950 A1 | 7/2006 | Auschra et al. | 525/89 |
| 2006/0194128 A1* | 8/2006 | Araki | 430/7 |
| 2006/0229407 A1 | 10/2006 | Vogel et al. | 524/561 |

FOREIGN PATENT DOCUMENTS

| | | |
|---|---|---|
| DE | 196 02 544 | 7/1997 |
| DE | 196 26 839 | 1/1998 |
| DE | 102 36 133 | 2/2004 |
| GB | 2335190 | 9/1999 |
| JP | 2002031713 | 1/2002 |
| JP | 2004339330 | 12/2004 |
| WO | 02/48205 | 6/2002 |
| WO | 03/046029 | 6/2003 |
| WO | 2004/058881 | 7/2004 |
| WO | 2004/090030 | 10/2004 |
| WO | 2004090030 A1 | 10/2004 |
| WO | 2005/037931 A1 | 4/2005 |
| WO | 2006/074969 | 7/2006 |
| WO | WO 2006/074969 * | 7/2006 |

OTHER PUBLICATIONS

Machine Translation of JP 2005232432 (Which Is the Equivalent to WO 2005/037931) Apr. 28, 2005.
English Language abstract of DE 196 26 839 from the esp@cenet web site printed on Dec. 11, 2008.
English language machine-generated translation for JP2002-031713 (19 pages); 2002.
English language machine-generated translation for JP2004-339330 (63 pages); 2004.

* cited by examiner

*Primary Examiner* — John A. McPherson
(74) *Attorney, Agent, or Firm* — Shruti Costales

(57) ABSTRACT

The invention relates to a color filter composition comprising a) a photoresist binder, b) a transparent pigment, c) optionally a solvent and/or optionally a photoinitiator or a photolatent catalyst, d) a dispersant which is a polymer or copolymer obtainable by a process comprising the steps of a1) polymerizing in a first step one or more ethylenically unsaturated monomers in the presence of at least one nitroxylether having the structural element wherein X represents a group having at least one carbon atom and is such that the free radical X derived from X is capable of initiating polymerization; or a2) polymerizing in a first step one or more ethylenically unsaturated monomers in the presence of at least one stable free nitroxyl radical and a free radical initiator; wherein at least one monomer used in the steps a1) or a2) is a $C_1$-$C_6$ alkyl or hydroxy $C_1$-$C_6$ alkyl ester of acrylic or methacrylic acid; and a second step b) comprising the modification of the polymer or copolymer prepared under a1) or a2) by a transesterification reaction, an amidation, hydrolysis or anhydride modification or a combination thereof, and optionally in addition by quaternization.

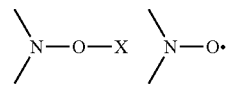

11 Claims, No Drawings

COLOR FILTER COMPOSITION

The present invention relates to a color filter composition and to a method for producing a color filter.

Typical methods for producing color filters are, for example, dyeing method, printing method, pigment dispersion method and electrodeposition method. Among them, particularly, the pigment dispersion method is widely used owing to the high precision in the position of color filter pixels, film thickness and the like, excellent durability such as light resistance and thermal resistance, and less defects of pinhole and the like. In the pigment dispersion method a pigment-dispersed photosensitive resin layer is formed on a substrate and patterned into a single-color pattern. This process is repeated three times to obtain R, G, and B color filter layers.

The Japanese Patent Publication JP2002031713 (Mitsubishi) discloses an alkaline developable composition for the manufacturing of a color filter. The composition for the color filter contains a binder resin and/or a compound having a polymerizable group, provided with an acidic group (1), a pigment (2) and a dispersing agent (3). The dispersing agent is an A-B block copolymer consisting of an A block with a quaternary ammonium base in a side chain.

The Japanese Patent Publication JP2004339330 (Dainippon Printing) discloses a method for producing a color filter by using a thermosetting ink.

The pigment dispersion for the thermosetting ink and the thermosetting ink comprise each at least a pigment, a pigment dispersant composed of a copolymer, which contains a molecular structure in which at least a constituent unit containing a specific quaternary ammonium base and a constituent unit containing a specific ester structure are coupled.

There is still a need to find further suitable dispersants having improved dispersing properties.

It has now been found that copolymers prepared by a controlled radical polymerization process as disclosed in the International Publication WO2006074969 (Application No. PCT/EP2006/050000 show improved dispersing properties when used as color filter compositions.

Thus, the invention relates to a color filter composition comprising
- a) a photoresist binder,
- b) a transparent pigment,
- c) optionally a solvent and/or optionally a photoinitiator or a photolatent catalyst,
- d) a dispersant which is a polymer or copolymer obtainable by a process comprising the steps of
  - a1) polymerizing in a first step one or more ethylenically unsaturated monomers in the presence of at least one nitroxylether having the structural element

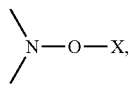

wherein X represents a group having at least one carbon atom and is such that the free radical X• derived from X is capable of initiating polymerization; or
  - a2) polymerizing in a first step one or more ethylenically unsaturated monomers in the presence of at least one stable free nitroxyl radical

and a free radical initiator; wherein at least one monomer used in the steps a1) or a2) is a $C_1$-$C_6$alkyl or hydroxy $C_1$-$C_6$ alkyl ester of acrylic or methacrylic acid; and
- b) in a second step modification of the polymer or copolymer prepared under a1) or a2) by a transesterification reaction, an amidation, hydrolysis or anhydride modification or a combination thereof; and optionally in addition by quaternization.

DEFINITIONS

The term photoresist binder refers to a photosensitive resin which is preferably an acid-curable resin or a photo curable resin such as acrylate, photo curable acrylate oligomer, polyester, alkyd, melamine, urea, epoxy and phenolic resins or mixtures thereof. Acid-curable resins of that kind are generally known and are described, for example, in "Ullmann's Encyclopdie dertechnischen Chemie", Edition 4, Vol. 15 (1978), pp. 613-628. Preferred are (meth)acrylate/(meth) acrylic acid copolymers.

Preferable examples of copolymers are copolymers of methyl (meth)acrylate and (meth)-acrylic acid, copolymers of benzyl (meth)acrylate and (meth)acrylic acid, copolymers of methyl (meth)acrylate/, ethyl (meth)acrylate and (meth) acrylic acid, copolymers of benzyl (meth)acrylate, (meth) acrylic acid and styrene, copolymers of benzyl (meth)acrylate, (meth)acrylic acid and 2-hydroxyethyl (meth)acrylate, copolymers of methyl (meth)acrylate/, butyl (meth)acrylate, (meth)acrylic acid and styrene, copolymers of methyl (meth) acrylate, benzyl (meth)acrylate, (meth)acrylic acid and hydroxyphenyl (meth)acrylate, copolymers of methyl (meth) acrylate, (meth)acrylic acid and polymethyl (meth)acrylate macromonomer, copolymers of benzyl (meth)acrylate, (meth)acrylic acid and polymethyl (meth)acrylate macromonomer, copolymers of tetrahydrofurfuryl (meth)acrylate, styrene and (meth)acrylic acid, copolymers of methyl (meth)acrylate, (meth)acrylic acid and polystyrene macromonomer, copolymers of benzyl (meth)acrylate, (meth) acrylic acid and polystyrene macromonomer, copolymers of benzyl (meth)acrylate, (meth)acrylic acid, 2-hydroxyethyl (meth)-acrylate and polystyrene macromonomer, copolymers of benzyl (meth)acrylate, (meth)acrylic acid, 2-hydroxypropyl (meth)acrylate and polystyrene macro monomer, copolymers of benzyl (meth)acrylate, (meth)acrylic acid, 2-hydroxy-3-phenoxypropyl (meth)acrylate and polymethyl (meth)acrylate macromonomer, copolymers of methyl (meth)acrylate, (meth)acrylic acid, 2-hydroxyethyl (meth) acrylate and polystyrene macromonomer, copolymers of benzyl (meth)-acrylate, (meth)acrylic acid, 2-hydroxyethyl (meth)acrylate and polymethyl (meth)acrylate macromonomer, copolymers of N-phenylmaleimide, benzyl (meth)acrylate, (meth)acrylic acid and styrene, copolymers of benzyl (meth)acrylate, (meth)acrylic acid, N-phenylmaleimide, mono-[2-(meth)acryloyloxyethyl]succinate and styrene, copolymers of allyl (meth)acrylate, (meth)acrylic acid, N-phenylmaleimide, mono-[2-(meth)acryloyloxyethyl]succinate and styrene, copolymers of benzyl (meth)acrylate, (meth)acrylic acid, N-phenylmaleimide, glycerol mono (meth)acrylate and styrene, copolymers of benzyl (meth) acrylate, [omega]-carboxypolycaprolactone mono(meth)

acrylate, (meth)acrylic acid, N-phenylmaleimide, glycerol mono(meth)acrylate and styrene, and copolymers of benzyl (meth)-acrylate, (meth)acrylic acid, N-cyclohexylmaleimide and styrene.

A photo curable acrylate oligomer is preferably present in addition to the photo curable resin. Photo curable acrylate oligomers usable herein include dipentaerythritol hexaacryl (DPHA), dipentaerythritol pentaacrylate (DPPA), pentaerythritol triacrylate (PETTA), trimethylol-propane triacrylate (TMPTA), and trimethylolpropane triacrylate (TMPTA) and the like.

The term transparent pigment refers to a pigment which gives a transparently colored ink when dispersed.

The pigment may be inorganic or preferably organic, for example carbon black or pigments of the 1-aminoanthraquinone, anthanthrone, anthrapyrimidine, azo, azomethine, quinacridone, quinacridonequinone, quinophthalone, dioxazine, diketopyrrolopyrrole, flavanthrone, indanthrone, isoindoline, isoindolinone, isoviolanthrone, perinone, perylene, phthalocyanine, pyranthrone or thioindigo series, including those, where applicable, in the form of metal complexes or lakes, in particular unsubstituted or partially halogenated phthalocyanines such as copper, zinc or nickel phthalocyanines, 1,4-diketo-3,6-diaryl-pyrrolo[3,4-c]pyrroles, dioxazines, isoindolinones, indanthrones, perylenes and quinacridones. Azo pigments may be, for example, mono- or dis-azo pigments from any known sub-class, obtainable, for example, by coupling, condensation or lake formation.

Notably useful are the pigments described in the Colour Index, including Pigment Yellow 1, 3, 12, 13, 14, 15, 17, 24, 34, 42, 53, 62, 73, 74, 83, 93, 95, 108, 109, 110, 111, 119, 120, 123, 128, 129, 139, 147, 150, 151, 154, 164, 168, 173, 174, 175, 180, 181, 184, 185, 188, 191, 191:1, 191:2, 193, 194 and 199; Pigment Orange 5, 13, 16, 22, 31, 34, 40, 43, 48, 49, 51, 61, 64, 71, 73 and 81; Pigment Red 2, 4, 5, 23, 48, 48:1, 48:2, 48:3, 48:4, 52:2, 53:1, 57, 57:1, 88, 89, 101, 104, 112, 122, 144, 146, 149, 166, 168, 170, 177, 178, 179, 181, 184, 185, 190, 192, 194, 202, 204, 206, 207, 209, 214, 216, 220, 221, 222, 224, 226, 242, 248, 254, 255, 262, 264, 270 and 272; Pigment Brown 23, 24, 25, 33, 41, 42, 43 and 44; Pigment Violet 19, 23, 29, 31, 37 and 42; Pigment Blue 15, 15:1, 15:2, 15:3, 15:4, 15:6, 16, 25, 26, 28, 29, 60, 64 and 66; Pigment Green 7, 17, 36, 37 and 50; Pigment Black 7, 12, 27, 30, 31, 32 and 37; Vat Red 74; 3,6-di(3',4'-dichloro-phenyl)-2,5-dihydro-pyrrolo[3,4-c]pyrrole-1,4-dione, 3,6-di(4'-cyano-phenyl)-2,5-dihydro-pyrrolo[3,4-c]pyrrole-1,4-dione and 3-phenyl-6-(4'-tert-butyl-phenyl)-2,5-dihydro-pyrrolo[3,4-c]pyrrole-1,4-dione; and mixtures and solid solutions thereof.

Solvent

Normally the compositions according to the invention are dissolved in a suitable solvent before application to the substrate. Examples of such solvents include ethylene dichloride, cyclohexanone, cyclopentanone, 2-heptanone, gamma-butyrolactone, methyl ethyl ketone, ethylene glycol monomethyl ether, ethylene glycol monoethyl ether, 2-methoxyethyl acetate, 2-ethoxyethyl acetate, 2-ethoxyethanol, diethyl glycol dimethyl ether, ethylene glycol monoethyl ether acetate, propylene glycol monomethyl ether, propylene glycol monomethyl ether acetate, toluene, ethyl acetate, methyl lactate, ethyl lactate, methylmethoxy propionate, ethylethoxy propionate, methyl pyruvate, ethyl pyruvate, propyl pyruvate, N,N-dimethyl-formamide, dimethyl sulfoxide, N-methylpyrrolidone and tetrahydrofuran. Such solvents can be used individually or in combinations. Preferred examples thereof are esters, such as 2-methoxyethyl acetate, ethylene glycol monoethyl ether acetate, propylene glycol monomethyl ether acetate, methylmethoxy propionate, ethylethoxy propionate and ethyl lactate.

Photoinitiator:

Any photoinitiator or photolatent catalyst may be used when desired. The photoinitiator or photolatent catalyst is not limited. Preferred are photoinitiators selected from 1. Alpha-hydroxyketones (AHK), alpha-alkoxyketones (benzildimethylketals DBK) and alpha-aminoketones (AAK),
2. Benzophenones,
3. Mono- and bisacylphosphine oxides (BAPO),
4. Phenyl-glyoxylates,
5. Isopropylthioxanthone (ITX),
6. Oxime-esters,
7. Aminobenzoates
8. Latent acids and bases and blends thereof.

Dispersant

Preferably the first polymerization step is carried out according to the polymerization reactions a1)

Preferably the second step b) is a transesterification reaction or amidation reaction. Particularly preferred is a transesterification reaction.

The transesterification preferably comprises the removal of the $C_1$-$C_6$ alcohol by-product by distillation.

In another embodiment the second step b) is a transesterification reaction followed by a quaternization.

In a specific embodiment step a1 or a2 of the above described process is carried out twice and a block copolymer is obtained wherein in the first or second radical polymerization step the monomer or monomer mixture contains 50 to 100% by weight, based on total monomers, of a $C_1$-$C_6$ alkyl or hydroxy $C_1$-$C_6$ alkyl ester of acrylic or methacrylic acid and in the second or first radical polymerization step respectively, the ethylenically unsaturated monomer contains no primary or secondary ester bond.

When a block copolymer is prepared it is preferred that in the first polymerization step the monomer or monomer mixture contains from 50 to 100% by weight based on total monomers of a $C_1$-$C_6$alkyl or hydroxy $C_1$-$C_6$alkyl ester of acrylic or methacrylic acid and in the second polymerization step the ethylenically unsaturated monomer is 4-vinyl-pyridine or pyridinium-ion, 2-vinyl-pyridine or pyridinium-ion, vinyl-imidazole or imidazolinium-ion, dimethylacrylamide, 3-dimethylaminopropylmethacrylamide, styrene, α-methyl styrene, p-methyl styrene or p-tert-butyl-styrene.

In a specific embodiment of the invention the block copolymer is a gradient block copolymer.

As mentioned above it is mandatory that the polymer or copolymer is prepared by controlled free radical polymerization (CFRP). Solomon et al. in U.S. Pat. No. 4,581,429 have firstly described such processes using stable free nitroxyl radicals as controlling agents. These are the steps defined under a1) and a2) above.

U.S. Pat. No. 4,581,429 discloses a free radical polymerization process by controlled or "living" growth of polymer chains, which produces defined oligomeric homopolymers and copolymers, including block and graft copolymers. Disclosed is the use of initiators of the partial formula R'R''N—O—X. In the polymerization process the free radical species R'R''N—O• and •X are generated. •X is a free radical group, e.g. a tert.-butyl or cyanoisopropyl radical, capable of polymerizing monomer units containing ethylene groups.

A variation of the above process is disclosed in U.S. Pat. No. 5,322,912 (Xerox) wherein the combined use of a free radical initiator and a stable free radical agent of the basic structure R'R"N—O• for the synthesis of homopolymers and block copolymers is described.

These processes are useful for the preparation of homo-, random-, block-, tapered-, graft- or comb (co)polymers, which have a narrow molecular weight distribution and hence a low polydispersity index.

For example the structural element

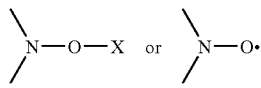

may be part of a cyclic ring system or substituted to form a acyclic structure.

Suitable nitroxylethers and nitroxyl radicals are principally known from U.S. Pat. No. 4,581,429 or EP-A-621 878.

Particularly useful are the open chain compounds described in WO 98/13392 (Akzo), WO 99/03894 (Ciba) and WO 00/07981 (Ciba), the piperidine derivatives described in WO 99/67298 (Ciba) and GB 2335190 (Ciba) or the heterocyclic compounds described in GB 2342649 (Ciba) and WO 96/24620 (Atochem).

Further suitable nitroxylethers and nitroxyl radicals are described in WO 02/4805 (Ciba) and in WO 02/100831 (Ciba).

Nitroxylethers and nitroxyl radicals with more than one nitroxyl group in the molecule are for example described in U.S. Pat. No. 6,573,347(Ciba), WO 01/02345 (Ciba) and WO 03/004471 (Ciba) These compounds are ideally suitable when branched, star or comb (co)polymers are prepared.

In the context of the present invention the terms alkoxyamine and nitroxylether are used as equivalents.

Stable free radicals having a structural element

are for example disclosed in EP-A-621 878 (Xerox).

Examples, such as

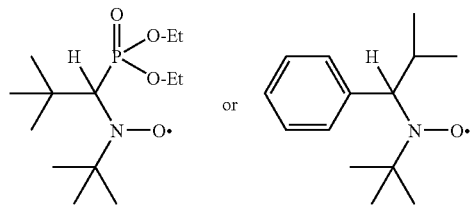

are given in WO96/24620 (Atochem).

Preferably the structural element

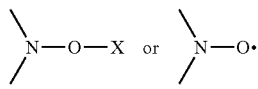

is part of a 5 or 6-membered heterocyclic ring, which optionally has an additional nitrogen or oxygen atom in the ring system. Substituted piperidine, morpholine and piperazine derivatives are particularly useful.

In one preferred embodiment, the structural element

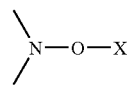

is a structural element of formula (I)

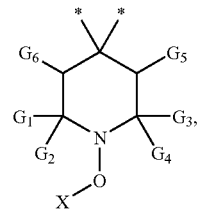

(I)

wherein
$G_1, G_2, G_3, G_4$ are independently $C_1$-$C_6$alkyl or $G_1$ and $G_2$ or $G_3$ and $G_4$, or $G_1$ and $G_2$ and $G_3$ and $G_4$ together form a $C_5$-$C_{12}$cycloalkyl group;
$G_5, G_6$ independently are H, $C_1$-$C_{18}$alkyl, phenyl, naphthyl or a group —COO$C_1$-$C_{18}$alkyl;
X is selected from the group consisting of —CH$_2$-phenyl, CH$_3$CH-phenyl, (CH$_3$)$_2$C-phenyl, ($C_5$-$C_6$cycloalkyl)$_2$CCN, (CH$_3$)$_2$CCN,

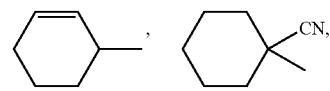

—CH$_2$CH=CH$_2$, CH$_3$CH—CH=CH$_2$, ($C_1$-$C_4$alkyl)CR$_{20}$—C(O)-phenyl, ($C_1$-$C_4$)alkyl-CR$_{20}$—C(O)—($C_1$-$C_4$)alkoxy, ($C_1$-$C_4$)alkyl-CR$_{20}$—C(O)—($C_1$-$C_4$)alkyl, ($C_1$-$C_4$)alkyl-CR$_{20}$—C(O)—N-di($C_1$-$C_4$)alkyl, ($C_1$-$C_4$)alkyl-CR$_{20}$—C(O)—NH($C_1$-$C_4$)alkyl, ($C_1$-$C_4$)alkyl-CR$_{20}$—C(O)—NH$_2$, wherein R$_{20}$ is hydrogen or ($C_1$-$C_4$)alkyl and
* denotes a valence.

In another preferred embodiment the structural element

is a structural element of formula (II)

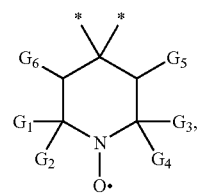

(II)

wherein
$G_1, G_2, G_3, G_4$ are independently $C_1$-$C_6$alkyl or $G_1$ and $G_2$ or $G_3$ and $G_4$, or $G_1$ and $G_2$ and $G_3$ and $G_4$ together form a $C_5$-$C_{12}$cycloalkyl group;

$G_5$, $G_6$ independently are H, $C_1$-$C_{18}$alkyl, phenyl, naphthyl or a group —COO$C_1$-$C_{18}$alkyl;
* denotes a valence.

In particular the structural element of formula (I) is of formula A, B or O,

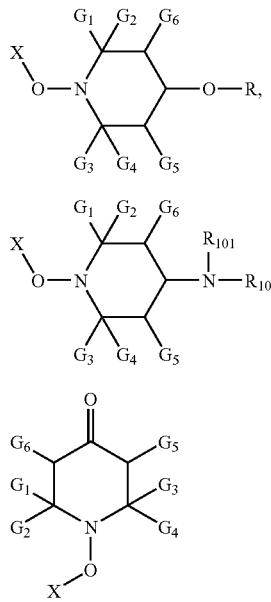

wherein
R is hydrogen, $C_1$-$C_{18}$alkyl which is uninterrupted or interrupted by one or more oxygen atoms, cyanoethyl, benzoyl, glycidyl, a monovalent radical of an aliphatic carboxylic acid having 2 to 18 carbon atoms, of a cycloaliphatic carboxylic acid having 7 to 15 carbon atoms, or an α,β-unsaturated carboxylic acid having 3 to 5 carbon atoms or of an aromatic carboxylic acid having 7 to 15 carbon atoms;
$R_{101}$ is $C_1$-$C_{12}$alkyl, $C_5$-$C_7$cycloalkyl, $C_7$-$C_8$aralkyl, $C_2$-$C_{18}$alkanoyl, $C_3$-$C_5$alkenoyl or benzoyl;
$R_{102}$ is $C_1$-$C_{18}$alkyl, $C_5$-$C_7$cycloalkyl, $C_2$-$C_8$alkenyl unsubstituted or substituted by a cyano, carbonyl or carbamide group, or is glycidyl, a group of the formula —CH$_2$CH(OH)—Z or of the formula —CO—Z or —CONH—Z wherein Z is hydrogen, methyl or phenyl;
$G_6$ is hydrogen and
$G_5$ is hydrogen or $C_1$-$C_4$alkyl,
$G_1$ and $G_3$ are methyl and $G_2$ and $G_4$ are ethyl or propyl or $G_1$ and $G_2$ are methyl and $G_3$ and
$G_4$ are ethyl or propyl; and
X is selected from the group consisting of —CH$_2$-phenyl, CH$_3$CH-phenyl, (CH$_3$)$_2$C-phenyl, ($C_5$-$C_6$cycloalkyl)$_2$CCN, (CH$_3$)$_2$CCN,

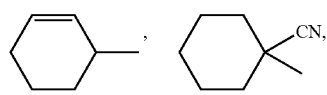

—CH$_2$CH=CH$_2$, CH$_3$CH—CH=CH$_2$, ($C_1$-$C_4$alkyl)CR$_{20}$—C(O)-phenyl, ($C_1$-$C_4$)alkyl-CR$_{20}$—C(O)—($C_1$-$C_4$)alkoxy, ($C_1$-$C_4$)alkyl-CR$_{20}$—C(O)—($C_1$-$C_4$)alkyl, ($C_1$-$C_4$)alkyl-CR$_{20}$—C(O)—N-di($C_1$-$C_4$)alkyl, ($C_1$-$C_4$)alkyl-CR$_{20}$—C(O)—NH($C_1$-$C_4$)alkyl, ($C_1$-$C_4$)alkyl-CR$_{20}$—C(O)—NH$_2$, wherein $R_{20}$ is hydrogen or ($C_1$-$C_4$)alkyl.

The above compounds and their preparation are described in GB2335190 and GB2361235.

Another preferred group of nitroxylethers are those of formula (Ic), (Id), (Ie), (If), (Ig) or (Ih)

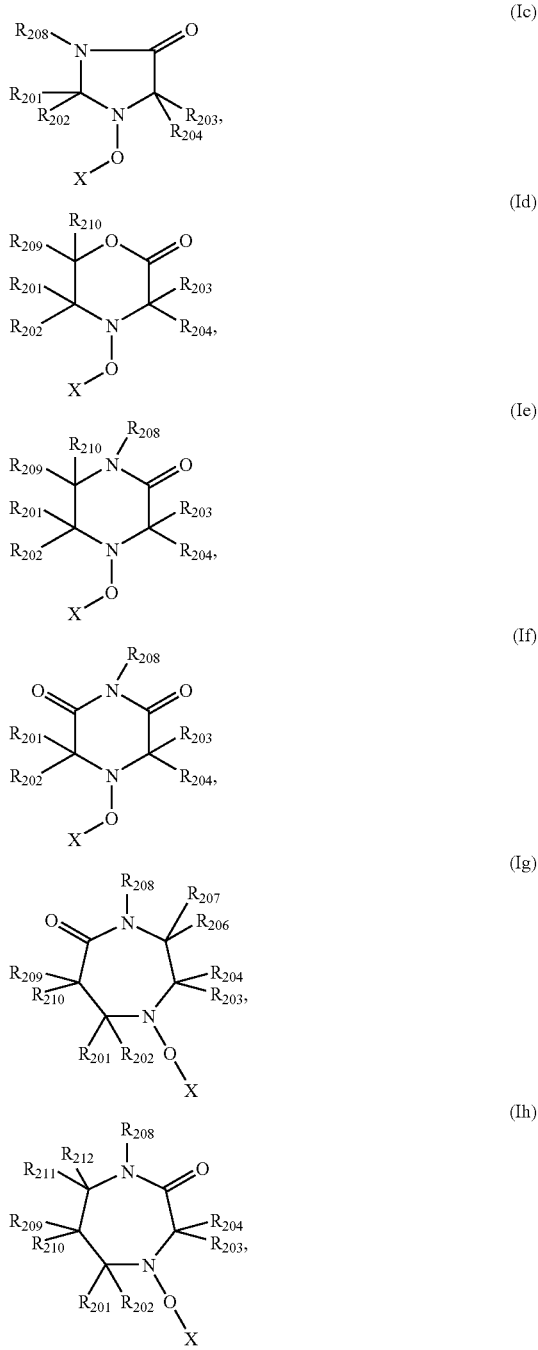

wherein
$R_{201}$, $R_{202}$, $R_{203}$ and $R_{204}$ independently of each other are $C_1$-$C_{18}$alkyl, $C_3$-$C_{18}$alkenyl, $C_3$-$C_{18}$alkinyl, $C_1$-$C_{18}$alkyl, $C_3$-$C_{18}$alkenyl, $C_3$-$C_{18}$alkinyl which are substituted by OH, halogen or a group —O—C(O)—$R_{205}$, $C_2$-$C_{18}$alkyl which is interrupted by at least one O atom and/or NR$_{205}$ group, $C_3$-$C_{12}$cycloalkyl or $C_6$-$C_{10}$aryl or $R_{201}$ and $R_{202}$ and/or $R_{203}$ and $R_{204}$ together with the linking carbon atom form a $C_3$-$C_{12}$cycloalkyl radical;

$R_{205}$, $R_{206}$ and $R_{207}$ independently are hydrogen, $C_1$-$C_{18}$alkyl or $C_6$-$C_{10}$aryl;

$R_{208}$ is hydrogen, OH, $C_1$-$C_{18}$alkyl, $C_3$-$C_{18}$alkenyl, $C_3$-$C_{18}$alkinyl, $C_1$-$C_{18}$alkyl, $C_3$-$C_{18}$alkenyl, $C_3$-$C_{18}$alkinyl which are substituted by one or more OH, halogen or a group —O—C(O)—$R_{205}$, $C_2$-$C_{18}$alkyl which is interrupted by at least one O atom and/or $NR_{205}$ group, $C_3$-$C_{12}$cycloalkyl or $C_6$-$C_{10}$aryl, $C_7$-$C_9$phenylalkyl, $C_5$-$C_{10}$heteroaryl, —C(O)—$C_1$-$C_{18}$alkyl, —O—$C_1$-$C_{18}$alkyl or —COO$C_1$-$C_{18}$alkyl;

$R_{209}$, $R_{210}$, $R_{211}$ and $R_{212}$ are independently hydrogen, phenyl or $C_1$-$C_{18}$alkyl; and X is selected from the group consisting of —$CH_2$-phenyl, $CH_3CH$-phenyl, $(CH_3)_2C$-phenyl, $(C_5$-$C_6$cycloalkyl)$_2$CCN, $(CH_3)_2$CCN,

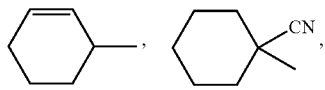

—$CH_2CH{=}CH_2$, $CH_3CH{-}CH{=}CH_2$ ($C_1$-$C_4$alkyl)$CR_{20}{-}C(O)$-phenyl, ($C_1$-$C_4$)alkyl-$CR_{20}{-}C(O){-}(C_1$-$C_4)$alkoxy, ($C_1$-$C_4$)alkyl-$CR_{20}{-}C(O){-}(C_1$-$C_4)$alkyl, ($C_1$-$C_4$)alkyl-$CR_{20}{-}C(O){-}N{-}di(C_1$-$C_4)$alkyl, ($C_1$-$C_4$)alkyl-$CR_{20}{-}C(O){-}NH(C_1$-$C_4)$alkyl, ($C_1$-$C_4$)alkyl-$CR_{20}{-}C(O){-}NH_2$, wherein $R_{20}$ is hydrogen or ($C_1$-$C_4$)alkyl.

More preferably in formula (Ic), (Id), (Ie), (If), (Ig) and (Ih) at least two of $R_{201}$, $R_{202}$, $R_{203}$ and $R_{204}$ are ethyl, propyl or butyl and the remaining are methyl; or $R_{201}$ and $R_{202}$ or $R_{203}$ and $R_{204}$ together with the linking carbon atom form a $C_5$-$C_6$cycloalkyl radical and one of the remaining substituents is ethyl, propyl or butyl.

Most preferably X is $CH_3CH$-phenyl.

The above compounds and their preparation are described in GB 2342649.

Further suitable compounds are the 4-imino compounds of formula (III) or (III')

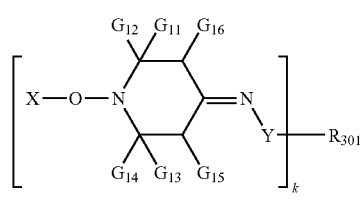

(III)

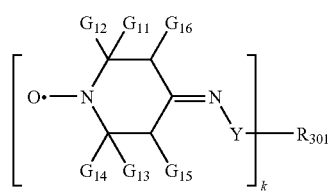

(III')

wherein $G_{11}$, $G_{12}$, $G_{13}$ and $G_{14}$ are independently $C_1$-$C_4$alkyl or $G_{11}$ and $G_{12}$ together and $G_{13}$ and $G_{14}$ together, or $G_{11}$ and $G_{12}$ together or $G_{13}$ and $G_{14}$ together are pentamethylene;

$G_{15}$ and $G_{16}$ are each independently of the other hydrogen or $C_1$-$C_4$alkyl;

X is as defined above;

k is 1, 2, 3, or 4

Y is O or $NR_{302}$ or when k is 1 and $R_{301}$ represents alkyl or aryl Y is additionally a direct bond;

$R_{302}$ is H, $C_1$-$C_{18}$alkyl or phenyl;

if k is 1

$R_{301}$ is H, straight or branched $C_1$-$C_{18}$alkyl, $C_3$-$C_{18}$alkenyl or $C_3$-$C_{18}$alkinyl, which may be unsubstituted or substituted, by one or more OH, $C_1$-$C_8$alkoxy, carboxy, $C_1$-$C_8$alkoxycarbonyl; $C_5$-$C_{12}$cycloalkyl or $C_5$-$C_{12}$cycloalkenyl;

phenyl, $C_7$-$C_9$phenylalkyl or naphthyl which may be unsubstituted or substituted by one or more $C_1$-$C_8$alkyl, halogen, OH, $C_1$-$C_8$alkoxy, carboxy, $C_1$-$C_8$alkoxycarbonyl;

—C(O)—$C_1$-$C_{36}$alkyl, or an acyl moiety of a α,β-unsaturated carboxylic acid having 3 to 5 carbon atoms or of an aromatic carboxylic acid having 7 to 15 carbon atoms;

—$SO_3^-Q^+$, —$PO(O^-Q^+)_2$, —$P(O)(OC_1$-$C_8$alkyl$_2)_2$, —$P(O)(OH_2)_2$, —$SO_2$—OH, —$SO_2$—$C_1$-$C_8$alkyl, —CO—NH—$C_1$-$C_8$alkyl, —$CONH_2$, COO—$C_1$-$C_8$alkyl$_2$, COOH or $Si(Me)_3$, wherein $Q^+$ is $H^+$, ammonium or an alkali metal cation;

if k is 2

$R_{301}$ is $C_1$-$C_{18}$alkylene, $C_3$-$C_{18}$alkenylene or $C_3$-$C_{18}$alkinylene, which may be unsubstituted or substituted, by one or more OH, $C_1$-$C_8$alkoxy, carboxy, $C_1$-$C_8$alkoxycarbonyl; or xylylene; or $R_{301}$ is a bisacyl radical of an aliphatic dicarboxylic acid having 2 to 36 carbon atoms, or a cycloaliphatic or aromatic dicarboxylic acid having 8-14 carbon atoms;

if k is 3, $R_{301}$ is a trivalent radical of an aliphatic, cycloaliphatic or aromatic tricarboxylic acid;

and if k is 4, $R_{301}$ is a tetravalent radical of an aliphatic, cycloaliphatic or aromatic tetracarboxylic acid.

Preferably $G_{16}$ is hydrogen and $G_{15}$ is hydrogen or $C_1$-$C_4$alkyl, in particular methyl, and $G_{11}$ and $G_{13}$ are methyl and $G_{12}$ and $G_{14}$ are ethyl or propyl or $G_{11}$ and $G_{12}$ are methyl and $G_{13}$ and $G_{14}$ are ethyl or propyl.

The 4 imino compounds of formula III can be prepared for example according to E. G. Rozantsev, A. V. Chudinov, V. D. Sholle.: Izv. Akad. Nauk. SSSR, Ser. Khim. (9), 2114 (1980), starting from the corresponding 4-oxonitroxide in a condensation reaction with hydroxylamine and subsequent reaction of the OH group. The compounds are described WO 02/100831 (Ciba)

In particular the structural element of formula (II) is of formula A', B' or O',

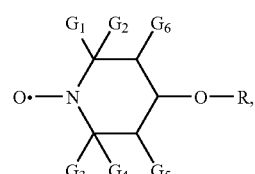

(A')

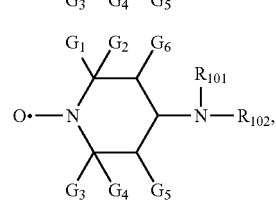

(B')

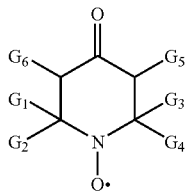

(O')

wherein
R is hydrogen, $C_1$-$C_{18}$alkyl which is uninterrupted or interrupted by one or more oxygen atoms, cyanoethyl, benzoyl, glycidyl, a monovalent radical of an aliphatic carboxylic acid having 2 to 18 carbon atoms, of a cycloaliphatic carboxylic acid having 7 to 15 carbon atoms, or an α,β-unsaturated carboxylic acid having 3 to 5 carbon atoms or of an aromatic carboxylic acid having 7 to 15 carbon atoms;
$R_{101}$ is $C_1$-$C_{12}$alkyl, $C_5$-$C_7$cycloalkyl, $C_7$-$C_8$aralkyl, $C_2$-$C_{18}$alkanoyl, $C_3$-$C_5$alkenoyl or benzoyl;
$R_{102}$ is $C_1$-$C_{18}$alkyl, $C_5$-$C_7$cycloalkyl, $C_2$-$C_8$alkenyl unsubstituted or substituted by a cyano, carbonyl or carbamide group, or is glycidyl, a group of the formula —$CH_2CH(OH)$—Z or of the formula —CO—Z or —CONH—Z wherein Z is hydrogen, methyl or phenyl;
$G_6$ is hydrogen and
$G_5$ is hydrogen or $C_1$-$C_4$alkyl, $G_1$ and $G_3$ are methyl and $G_2$ and $G_4$ are ethyl or propyl or $G_1$ and $G_2$ are methyl and $G_3$ and $G_4$ are ethyl or propyl.

The alkyl radicals in the various substituents may be linear or branched. Examples of alkyl containing 1 to 18 carbon atoms are methyl, ethyl, propyl, isopropyl, butyl, 2-butyl, isobutyl, t-butyl, pentyl, 2-pentyl, hexyl, heptyl, octyl, 2-ethylhexyl, t-octyl, nonyl, decyl, undecyl, dodecyl, tridecyl, tetradecyl, hexadecyl and octadecyl.

Alkenyl with 3 to 18 carbon atoms is a linear or branched radical as for example propenyl, 2-butenyl, 3-butenyl, isobutenyl, n-2,4-pentadienyl, 3-methyl-2-butenyl, n-2-octenyl, n-2-dodecenyl, iso-dodecenyl, oleyl, n-2-octadecenyl or n-4-octadecenyl. Preferred is alkenyl with 3 to 12, particularly preferred with 3 to 6 carbon atoms.

Alkinyl with 3 to 18 is a linear or branched radical as for example propinyl (—CH—C≡CH), 2-butinyl, 3-butinyl, n-2-octinyl, or n-2-octadecinyl. Preferred is alkinyl with 3 to 12, particularly preferred with 3 to 6 carbon atoms.

Examples for hydroxy substituted alkyl are hydroxy propyl, hydroxy butyl or hydroxy hexyl.

Examples for halogen substituted alkyl are dichloropropyl, monobromobutyl or trichlorohexyl.

$C_2$-$C_{18}$alkyl interrupted by at least one O atom is for example —$CH_2$—$CH_2$—O—$CH_2$—$CH_3$, —$CH_2$—$CH_2$—O—$CH_3$— or —$CH_2$—$CH_2$—O—$CH_2$—$CH_2$—$CH_2$—O—$CH_2$—$CH_3$—.

It is preferably derived from polyethlene glycol. A general description is —$((CH_2)_a$—O$)_b$—H/$CH_3$, wherein a is a number from 1 to 6 and b is a number from 2 to 10.

$C_2$-$C_{18}$alkyl interrupted by at least one $NR_{205}$ group may be generally described as —$((CH_2)_a$—$NR_{205})_b$—H/$CH_3$, wherein a, b and $R_{205}$ are as defined above.

$C_3$-$C_{12}$cycloalkyl is typically, cyclopropyl, cyclopentyl, methylcyclopentyl, dimethylcyclopentyl, cyclohexyl, methylcyclohexyl or trimethylcyclohexyl.

$C_6$-$C_{10}$ aryl is e.g. phenyl or naphtyl, but also comprised are $C_1$-$C_4$alkyl substituted phenyl, $C_1$-$C_4$alkoxy substituted phenyl, hydroxy, halogen or nitro substituted phenyl. Examples for alkyl substituted phenyl are ethylbenzene, toluene, xylene and its isomers, mesitylene or isopropylbenzene. Halogen substituted phenyl is e.g. dichlorobenzene or bromotoluene.

Alkoxy substituents are typically methoxy, ethoxy, propoxy or butoxy and their corresponding isomers.

$C_7$-$C_9$-phenylalkyl is benzyl, phenylethyl or phenylpropyl.

$C_5$-$C_{10}$heteroaryl is for example pyrrol, pyrazol, imidazol, 2,4, dimethylpyrrol, 1-methylpyrrol, thiophene, furane, furfural, indol, cumarone, oxazol, thiazol, isoxazol, isothiazol, triazol, pyridine, α-picoline, pyridazine, pyrazine or pyrimidine.

If R is a monovalent radical of a carboxylic acid, it is, for example, an acetyl, propionyl, butyryl, valeroyl, caproyl, stearoyl, lauroyl, acryloyl, methacryloyl, benzoyl, cinnamoyl or β-(3,5-di-tert-butyl-4-hydroxyphenyl)propionyl radical.

$C_1$-$C_{18}$alkanoyl is for example, formyl, propionyl, butyryl, octanoyl, dodecanoyl but preferably acetyl and $C_3$-$C_5$alkenoyl is in particular acryloyl.

In particular polymerization process a1) is very suitable. When process a1) is used the nitroxylether according to the structures outlined above splits between the O—X bond. The regulating fragment in formula (I) corresponds to the O—N fragment and the initiating fragment (In) corresponds to the C centered radical of the group X.

Particularly suitable nitroxylethers and nitroxyl radicals are those of formulae

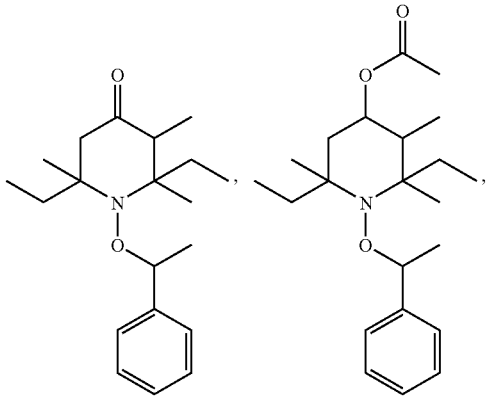

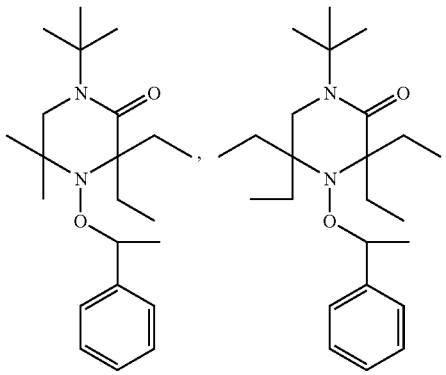

-continued

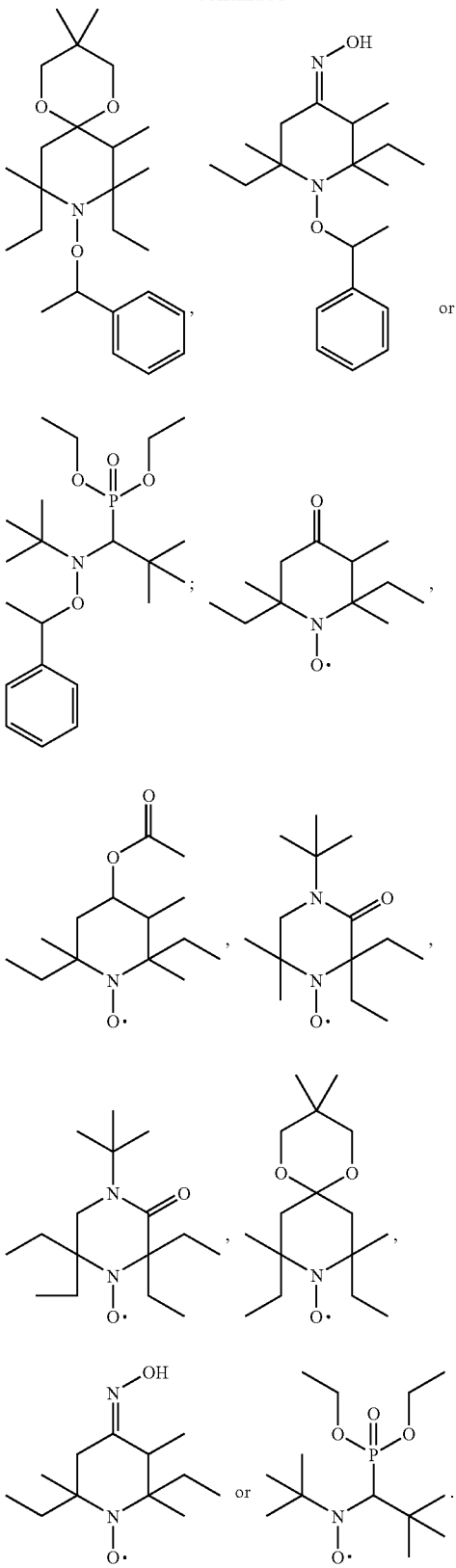

In a very specific embodiment of the invention, the polymer or copolymer is prepared with a compound of formula (O1)

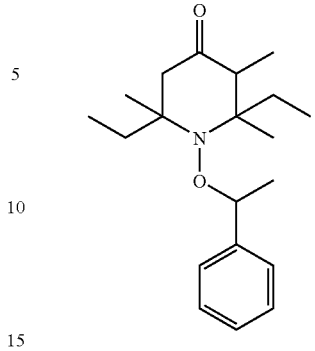

(O1)

Preferably the initiator compound is present in an amount of from 0.01 mol-% to 30 mol-%, more preferably in an amount of from 0.1 mol-% to 20 mol-% and most preferred in an amount of from 0.1 mol-% to 10 mol-% based on the monomer or monomer mixture.

When monomer mixtures are used mol % is calculated on the average molecular weight of the mixture.

When the process according to route a2) is chosen, the free radical initiator is preferably an azo compound, a peroxide, perester or a hydroperoxide.

Specific preferred radical sources are 2,2'-azobisisobutyronitrile, 2,2'-azobis(2-methyl-butyronitrile), 2,2'-azobis(2,4-dimethylvaleronitrile), 2,2'-azobis(4-methoxy-2,4-dimethylvaleronitrile), 1,1'-azobis(1-cyclohexanecarbonitrile), 2,2'-azobis(isobutyramide) dihydrate, 2-phenylazo-2,4-dimethyl-4-methoxyvaleronitrile, dimethyl-2,2'-azobisisobutyrate, 2-(carbamoylazo)isobutyronitrile, 2,2'-azobis(2,4,4-trimethylpentane), 2,2'-azobis(2-methylpropane), 2,2'-azobis(N,N'-dimethyleneisobutyramidine), free base or hydrochloride, 2,2'-azobis(2-amidinopropane), free base or hydrochloride, 2,2'-azobis{2-methyl-N-[1,1-bis(hydroxy-methyl)ethyl]propionamide} or 2,2'-azobis{2-methyl-N-[1,1-bis(hydroxymethyl)-2-hydroxy-ethyl]propionamide; acetyl cyclohexane sulphonyl peroxide, diisopropyl peroxy dicarbonate, t-amyl perneodecanoate, t-butyl perneodecanoate, t-butyl perpivalate, t-amylperpivalate, bis(2,4-dichlorobenzoyl)peroxide, diisononanoyl peroxide, didecanoyl peroxide, dioctanoyl peroxide, dilauroyl peroxide, bis(2-methylbenzoyl) peroxide, disuccinic acid peroxide, diacetyl peroxide, dibenzoyl peroxide, t-butyl per 2-ethylhexanoate, bis-(4-chlorobenzoyl)-peroxide, t-butyl perisobutyrate, t-butyl permaleinate, 1,1-bis(t-butylperoxy)3,5,5-trimethyl-cyclohexane, 1,1-bis(t-butylperoxy)cyclohexane, t-butyl peroxy isopropyl carbonate, t-butyl perisononaoate, 2,5-dimethylhexane 2,5-dibenzoate, t-butyl peracetate, t-amyl perbenzoate, t-butyl perbenzoate, 2,2-bis(t-butylperoxy) butane, 2,2 bis(t-butylperoxy) propane, dicumyl peroxide, 2,5-dimethylhexane-2,5-di-t-butylperoxide, 3-t-butylperoxy 3-phenylphthalide, di-t-amyl peroxide, α,α'-bis(t-butylperoxy isopropyl)benzene, 3,5-bis(t-butylperoxy)3,5-dimethyl 1,2-dioxolane, di-t-butyl peroxide, 2,5-dimethylhexyne-2,5-di-t-butylperoxide, 3,3,6,6,9,9-hexamethyl 1,2,4,5-tetraoxa cyclononane, p-menthane hydroperoxide, pinane hydroperoxide, diisopropylbenzene mono-α-hydroperoxide, cumene hydroperoxide or t-butyl hydroperoxide.

The radical source is preferably present in an amount of from 0.01 mol-% to 30 mol-%, more preferred in an amount of from 0.1 mol-% to 20 mol-% and most preferred in an amount of from 0.5 mol-% to 10 mol-% based on the monomer or monomer mixture.

The molar ratio of the radical source to the nitroxyl radical may be from 1:10 to 10:1, preferably from 1:5 to 5:1 and more preferably from 1:2 to 2:1.

The polymer or copolymer can also be prepared in a controlled way by atom transfer radical polymerization (ATRP). This type of polymerization is, for example, described in WO 96/30421.

Reversible addition fragmentation chain transfer polymerization (RAFT) is also a well known controlled free radical polymerization technique and for example described in WO 98/01478, WO98/58974, WO 99/31144, WO 99/05099, WO 02/094887, WO 02/26836, WO 01/42312, WO 00/75207, and WO 99/35177.

The polymer or copolymer prepared according to steps a1) or a2) has preferably a polydispersity index of 1.0 to 2.2, more preferably from 1.1 to 1.9 and most preferably from 1.1 to 1.5.

As already mentioned above the second reaction step b), i.e. the polymer analogous reaction, is a transesterification reaction, an amidation, hydrolysis or anhydride modification or a combination thereof, and optionally in addition by quaternization.

Hydrolysis means the cleavage of an ester bond under alkaline or acidic conditions and can be carried out when the polymer or copolymer contains ester functionalities. The degree of hydrolysis may vary in a wide range and depends on reaction time and conditions. For example 5 to 100%, preferably 10% to 70% of the ester functionalities may be hydrolized, to form the free acid group, from which also a salt can be prepared. The metal ion is preferably an alkali metal ion, such as $Li^+$, $Na^+$ or $Ka^+$ or an ammonium cation, such as $NH_4^+$ or $NR_{404}^+$, wherein $R_{404}$ is hydrogen or $C_1$-$C_{18}$alkyl.

Anhydride modification can be carried out when the polymer or copolymer contains hydroxyl functionalities. The hydroxyl functionalities come for example from hydroxyl functional monomers, such as hydroxyethyl acrylate or methacrylate. Virtually all aliphatic or aromatic anhydrides can be used in the modification process. Examples for anhydrides are maleic acid anhydride, pyromelitic acid anhydride, cyclohexyldiacid anhydride, succinic acid anhydride, camphoric acid anhydride.

Transesterification means to replace the alcohol radical in an ester group of the polymer or copolymer by another alcohol radical. Preferably the alcohol radical to be replaced is methanol, ethanol, propanol or butanol. Typically the transesterification reaction is carried out at elevated temperatures, typically 70-200° C., by reacting the CFRP polymer with the corresponding alcohol using well-known catalysts, such as tetra-isopropyltitanate, tetrabutyltitanate, alkali- or earth alkali alcoholates like NaOMe or LiOMe. Typically the low boiling product alcohol is removed from the transesterification reaction mixture by distillation. If needed, catalyst residues may be removed by adsorption or extraction or otherwise processed or inactivated by known methods, like hydrolysis with water or acids.

The choice of the replacing alcohol is important. The replacing alcohol controls the properties of the resulting copolymer.

Using a polar replacing alcohol such as alcohols having e.g. the following formula R—[O—$CH_2$—$CH_2$—], —OH, e.g. methoxypoly4ethylene glycol (MPEG-OH), it is possible to obtain a water soluble resulting polymer. Of course the solubility depends on the amount of transesterified monomer units. At least 40% of the units should be transesterified to obtain the desired effect.

If solubility in organic solvents is required non polar alcohols like higher molecular weight branched aliphatic alcohols can be beneficial.

If polymers with low surface tension are desired, alcohols containing siloxane groups are preferred, e.g. with the following formula

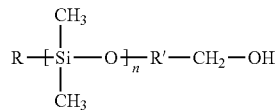

or partly or fully fluorinated primary alcohols can be used instead or in addition.

If a solid copolymer is required, solid alcohols or polar alcohols which are able to raise the glass transition temperature (Tg) or impart side chain crystallinity should be used. An example is behenyl alcohol.

The replacing alcohol radical is typically an aliphatic $C_6$-$C_{36}$alcohol or a precursor of an alcohol, having at least one —OH group. The alcohol may also be interrupted by 1 to 20 O or N atoms or substituted by halogen, perfluoralkyl, $NH_2$, $NH(C_1$-$C_{18}$alkyl), $N(C_1$-$C_{18}$alkyl)$_2$, $COO(C_1$-$C_{18}$alkyl), $CON(C_1$-$C_{18}$alkyl)$_2$, $CONH(C_1$-$C_{18}$alkyl), $CONH_2$, COOH, $COO^-$, $O(C_1$-$C_{18}$alkyl) or with a Si, P or S containing group, for example alkylhydroxysilicones. The alcohol may also contain heterocyclic ring structures, such as 1-(2-hydroxyethyl)-2-pyrrolidinone, 1-(2-hydroxyethyl)-2-imidazolidinone, 2-(2-hydroxyethyl)pyridine, N-2-hydroxyethyl)phtalimide, 4-(2-hydroxyethyl)morpholine, 1-(2-hydroxyethyl)piperazine, N-hydroxymethylphthalimide, 3-hydroxymethylpyridine or (4-pyridyl)-1-propanol.

The alcohols, which are interrupted by O or N atoms are not limited to 36 C atoms. These can be oligomeric or polymeric alcohols also. Examples of alcohols interrupted by O atoms are methoxypolyethyleneglycols or all kinds of adducts of ethyleneoxide and/or propylene-oxide (EO/PO). Such EO/PO-adducts can be random or block type structures.

Preferably the alcohol is an unsubstituted linear or branched $C_8$-$C_{36}$alkyl mono alcohol or a mono alcohol derived from ethylenoxide, propylenoxide or mixtures thereof with up to 100 C atoms. Especially preferred is MPEG-OH.

It is also possible to use fatty acid alcohol ethoxylates, alkylphenolethoxylates, alkoxylates of all kinds of monofuntional alcohols or phenols or secondary amines.

Preferably the alkoxylate is an ethoxylate of a primary alcohol or alkylphenol of structure (A):

R—[O—$CH_2$—$CH_2$—]$_n$—OH                (A)

wherein R is saturated or unsaturated, linear or branched chain alkyl with 1-22 carbon atoms, or alkylaryl or dialkylaryl with up to 24 carbon atoms and n is 1 to 50.

Referring to an other embodiment the alcohol is an unsubstituted linear or branched $C_8$-$C_{36}$alkyl mono alcohol or mixtures thereof. An example is a mixture of iso $C_{12}$-$C_{15}$ alcohol. Non-polar polymers or copolymers are obtained.

In another embodiment, the macroalcohol is a primary OH-functional silicone oligomer. Preferred are polydimethylsilicone oligomers of structure (B):

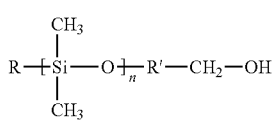 (B)

wherein
R is $C_1$-$C_{18}$alkyl, phenyl or $C_7$-$C_{15}$aralkyl; n is 1 to 50 and R' is a linking group with 1 to 20 carbon atoms.

Typical linking groups are $C_1$-$C_{18}$alkylene, phenylene or $C_1$-$C_{18}$alkylene interrupted by 1 to 6 oxygen atoms.

In another embodiment the alcohol is a partly or fully fluorinated primary alcohols. Examples of commercial fluorinated alcohol mixtures are: Zonyl BA®, Zonyl BA-L®, Zonyl BA-LD®, Zonyl BA-N® from Du Pont.

Aryl is phenyl or naphthyl, preferably phenyl.

Precursors of alcohols are for example macroalcohols, such as poly-ε-caprolactone oligomers or ε-caprolactone adducts and similar lactone adducts (e.g. based on valerolactone) or mixed adducts of ε-caprolactone and valerolactone. Typical lactone adducts are adducts of ε-caprolactone to long chain fatty alcohols of structure:

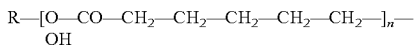

wherein R is saturated or unsaturated, linear or branched chain alkyl with 8-22 carbon atoms or alkylaryl or dialkylaryl with up to 24 carbon atoms and n is 1 to 50.

It is also possible to use macroalcohols based on polyolefins, which have typically molecular weights up to 5000, preferably up to 2000.

Yet another embodiment are unsaturated alcohols containing carbon-carbon double bonds or carbon triple bonds. An example is oleyl alcohol. Regarding triple bond preferred are primary alkinols like propargyl alcohol and higher homologues like alkylsubstituted propargylalcohol.

Preferably the alcohol is a monoalcohol and is a primary or secondary alcohol. Most preferred are primary alcohols or alcohol mixtures like Lial 125.

Preferably the alcohol or alcohol mixture is non-volatile and has a boiling point or range of at least 100° C., more preferably of at least 200° C.

The quaternization means the formation of ammonium salts of the amino group present in amino monomers selected from the group consisting of amino substituted styrene, ($C_1$-$C_4$alkyl)$_{1-2}$amino substituted styrene, N-mono-($C_1$-$C_4$ alkyl)$_{1-2}$amino$C_2$-$C_4$alkyl(meth)-acrylamide and N,N-di-($C_1$-$C_4$alkyl)$_{1-2}$amino-$C_2$-$C_4$alkyl(meth)acrylamide, vinylpyridine or $C_1$-$C_4$alkyl substituted vinylpyridine, vinylimidazole and $C_1$-$C_4$alkyl substituted vinylimidazole.

Representative N-mono-($C_1$-$C_4$alkyl)$_{1-2}$amino-$C_2$-$C_4$alkyl(meth)acrylamide and N,N-di-($C_1$-$C_4$alkyl)$_{1-2}$amino-$C_2$-$C_4$alkyl(meth)acrylamide are 2-N-tert-butylamino- or 2-N,N-dimethyl-aminoethylacrylamide or 2-N-tert-butylamino- or 2-N,N-dimethylaminopropylmethacrylamide.

Quaternization is effected with active alkyl halides or alkyl esters of organic sulphonic acids. In this case examples of preferred salt forming components are benzylchloride, 2-chlorobenzylchloride, 4-chlorobenzylchloride, 2,4-dichlorobenzylchloride, p-toluene sulphonic acid methyl ester, p-toluene sulphonic acid ethyl ester, especially preferred 4-chlorobenzylchloride.

Under the term amidation there is understood the modification of the ester function of a polyacrylate with an amine under the formation of an amide bond. Preferably the amine is a monofunctional primary or secondary amine, most preferably a primary aliphatic or aromatic amine. The reaction of the amine with the ester function of the CFRP polymer is typically conducted at elevated temperatures of 70-200° C., optionally in presence of catalysts. In a preferred process, the resulting alcohol is removed during the amidation reaction by distillation.

Preferably the amine has a high boiling point or boiling range of above 100° C.

Typical amines are primary aliphatic or aromatic amines with up to 36 carbon atoms, linear, branched or cyclic. The amine may contain heteroatoms O or N.

In a preferred embodiment there are oligomers and macroamines with a single primary amine and molecular weights of up to 5000. Typical examples are primary amine endfunctional alkoxylates. Especially preferred are also primary amines containing other polar groups like ether, ester and amide groups.

In principal the monomer in step a1 or a2 can be selected from isoprene, 1,3-butadiene, α-$C_5$-$C_{18}$alkene, 4-vinyl-pyridine or pyridinium-ion, 2-vinyl-pyridine or pyridinium-ion, vinyl-imidazole or imidazolinium-ion, dimethylacrylamide, 3-dimethylaminopropylmethacrylamide, styrene, α-methyl styrene, p-methyl styrene, p-tert-butyl-styrene or a compound of formula $CH_2=C(R_a)-(C=Z)-R_b$, wherein $R_a$ is hydrogen or $C_1$-$C_4$alkyl, $R_b$ is $NH_2$, $O^-(Me^+)$, unsubstituted $C_1$-$C_{18}$alkoxy, $C_2$-$C_{100}$alkoxy interrupted by at least one N and/or O atom, or hydroxy-substituted $C_1$-$C_{18}$alkoxy, unsubstituted $C_1$-$C_{18}$alkylamino, di($C_1$-$C_{18}$alkyl)amino, hydroxy-substituted $C_1$-$C_{18}$alkylamino or hydroxy-substituted di($C_1$-$C_{18}$alkyl)amino, $-O-CH_2-CH_2-N(CH_3)_2$ or $-O-CH_2-CH_2-N^+H(CH_3)_2An^-$;

$An^-$ is a anion of a monovalent organic or inorganic acid;

Me is a monovalent metal atom or the ammonium ion.

Z is oxygen or sulfur

Preferred are 3-dimethylaminopropylmethacrylamide, 2-vinyl-pyridine, 4-vinyl-pyridine, hydroxyethylacrylate, hydroxyproylacrylate, n-butylacrylate, styrene.

Examples for $R_b$ as $C_2$-$C_{100}$alkoxy interrupted by at least one O atom are of formula

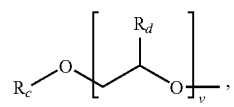

wherein $R_c$ is $C_1$-$C_{25}$alkyl, phenyl or phenyl substituted by $C_1$-$C_{18}$alkyl, $R_d$ is hydrogen or methyl and v is a number from 1 to 50. These monomers are for example derived from non ionic surfactants by acrylation of the corresponding alkoxylated alcohols or phenols. The repeating units may be derived from ethylene oxide, propylene oxide or mixtures of both.

Further examples of suitable acrylate or methacrylate monomers are given below.

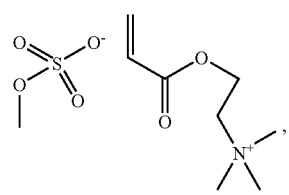

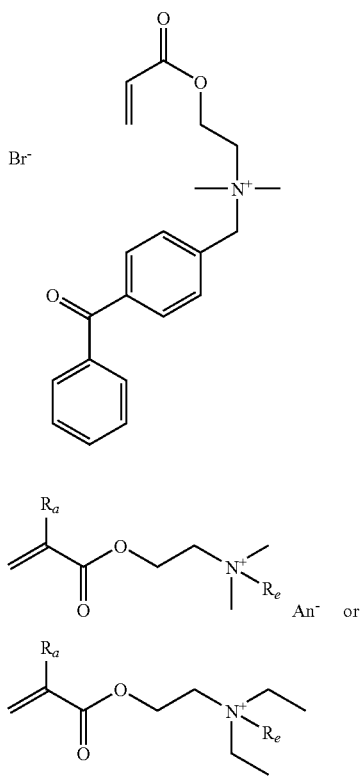

An⁻, wherein An⁻ and $R_a$ have the meaning as defined above and $R_e$ is methyl, benzyl or benzoylbenzyl. An⁻ is preferably Cl⁻, Br⁻ or ⁻O$_3$S—O—CH$_3$.

Further acrylate monomers are

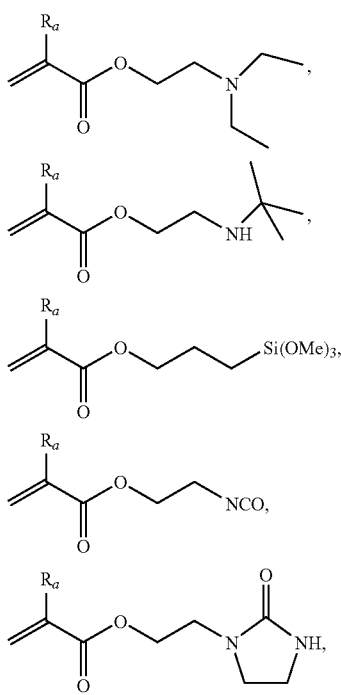

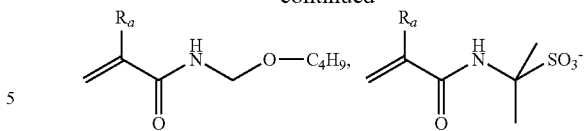

Me⁺, Me⁺ is an alkali metal cation or the ammonium cation.

Useful are also silicone functional (meth)acrylates.

Examples for suitable monomers other than acrylates are

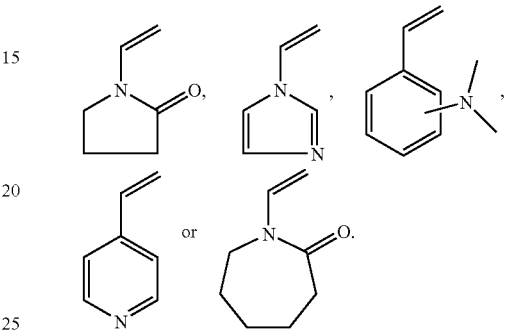

Preferably $R_a$ is hydrogen or methyl, $R_b$ is NH$_2$, glycidyl, unsubstituted or with hydroxy substituted C$_1$-C$_4$alkoxy, unsubstituted C$_1$-C$_4$alkylamino, di(C$_1$-C$_4$alkyl)amino, hydroxy-substituted C$_1$-C$_4$alkylamino or hydroxy-substituted di(C$_1$-C$_4$alkyl)amino; and Z is oxygen.

For example the ethylenically unsaturated monomer is selected from the group consisting of ethylene, propylene, n-butylene, i-butylene, styrene, substituted styrene, conjugated dienes, acrolein, vinyl acetate, vinylpyrrolidone, vinylimidazole, maleic anhydride, (alkyl)acrylic acid-anhydrides, (alkyl)acrylic acid salts, (alkyl)acrylic esters, (alkyl) acrylonitriles, (alkyl)acryl-amides, vinyl halides or vinylidene halides.

For instance the ethylenically unsaturated monomer is styrene, substituted styrene, methyl-acrylate, ethylacrylate, butylacrylate, isobutylacrylate, tert. butylacrylate, hydroxyethylacrylate, hydroxypropylacrylate, dimethylaminoethylacrylate, methyl(meth)acrylate, ethyl-(meth)acrylate, butyl (meth)acrylate, hydroxyethyl(meth)acrylate, hydroxypropyl (meth)-acrylate, dimethylaminoethyl(meth)acrylate, acrylonitrile, methacrylonitrile, acrylamide, methacrylamide or dimethylaminopropyl-methacrylamide.

Very suitable monomers are for example styrene, C$_1$-C$_8$alkylesters of acrylic or methacrylic acid, such as n-butylacrylate or methacrylate, acrylonitrile or methacrylonitrile, in particular styrene, acrylonitrile and n-butylacrylate.

It is also possible to use mixtures of the aforementioned monomers, in particular styrene/acrylonitrile, styrene/butylacrylate, styrene/methylmethacrylate and styrene/butylmethacrylate Preference is given to a polymerizable composition wherein the ethylenically unsaturated monomer is a compound of formula CH$_2$=C(R$_a$)—(C=Z)—R$_b$, wherein Z is O or S;

$R_a$ is hydrogen or C$_1$-C$_4$alkyl;

$R_b$ is NH$_2$, O⁻(Me⁺), glycidyl, unsubstituted C$_1$-C$_{18}$alkoxy, C$_2$-C$_{100}$alkoxy interrupted by at least one N and/or O atom, or hydroxy-substituted C$_1$-C$_{18}$alkoxy, unsubstituted C$_1$-C$_{18}$alkylamino, di(C$_1$-C$_{18}$alkyl)amino, hydroxy-substituted C$_1$-C$_{18}$alkylamino or hydroxy-substituted di(C$_1$-

$C_{18}$alkyl)amino, —O—CH$_2$—CH$_2$—N(CH$_3$)$_2$ or —O—CH$_2$—CH$_2$—N$^+$H(CH$_3$)$_2$An$^-$;

An$^-$ is a anion of a monovalent organic or inorganic acid;

Me is a monovalent metal atom or the ammonium ion.

All possible polymer chain structures are comprised: e.g. linear or branched. If the monomers are selected from chemically different monomers, all possible monomer sequence structures are comprised, e.g. random-, blocklike, multi-block-, tapered- or gradient arrangement of the different monomers.

Under gradient polymers or gradient arrangement there are understood block copolymers, which are prepared in such a way, that the intersection between the two blocks is not a sharp boundary, but represents a continuous transition from one type of monomer to another type of monomer, i.e. both monomers extending to both blocks. This type of polymers can be obtained when the polymerization process is carried out for example in one step using monomers of different copolymerization parameters or by a multistep procedure, in which the monomer composition is stepwise changed by addition of appropriate amounts of another type of monomer. Another preferred procedure for the synthesis of gradient polymers is by using continuous feed processes, in which for example the controlled polymerization is started with a first monomer and before complete conversion, a second monomer is continuously fed to the reaction mixture, thus realizing a continuous transition along the polymer chains.

When step a1 or a2 of the process is carried out twice and a block copolymer is obtained for example the monomer or monomer mixture of the first radical polymerization contains from 50 to 100% by weight based on total monomers of a $C_1$-$C_4$ alkyl or hydroxyalkyl ester of acrylic or methacrylic acid and the second radical polymerization contains a monomer or monomer mixture possessing no primary or secondary ester bond.

Suitable monomers for the second radical polymerization do not react in the postmodification reaction, such as vinyl aromatic monomers or vinyl-aza-heterocycles.

Examples are 4-vinyl-pyridine(pyridinium-ion), 2-vinyl-pyridine(pyridinium-ion), vinyl-imidazole(imidazolinium-ion), dimethylacrylamide, acrylnitrile, 3-dimethylaminopropyl-methacryl-amide, styrene or substituted styrenes.

Naturally the sequence of the first and second radical polymerization can also be reversed.

When a block copolymer is prepared it is preferred that in the first polymerization the monomer or monomer mixture contains from 50 to 100% by weight based on total monomers of a $C_1$-$C_6$ alkyl or hydroxyalkyl ester of acrylic or methacrylic acid and in the second polymerization the ethylenically unsaturated monomer is 4-vinyl-pyridine or pyridinium-ion, 2-vinyl-pyridine or pyridinium-ion, vinyl-imidazole or imidazolinium-ion, dimethylacrylamide, 3-dimethylaminopropylmethacrylamide, styrene, α-methyl styrene, p-methyl styrene or p-tert-butyl-styrene.

In another specific embodiment of the invention, the monomers of the controlled polymer prepared according to a first step a1) or a2) contain aminic or acid groups, is than modified in a second step by a transesterification reaction, an amidation, hydrolysis or anhydride modification and thereafter the aminic or acid groups of the modified controlled polymer are converted to salt structures by reaction with a salt forming component. Typical salt forming components for amino groups are for example organic or inorganic acids or alkylhalogenides, especially such salt forming components, which are based on organic cyclic acids or cyclic alkylhalogenides. Typical examples of such salt forming components are described in EP 1275689 (Ciba) and WO 03/046029 (Ciba)

Typical salt forming components for acid groups on the modified controlled polymer are inorganic bases, such as NaOH, KOH, NH4OH or volatile aminoalcohols, such as 2-di-methylaminoethanol or 2-amino-2-methylpropanol (AMP), which are frequently used in coatings.

It is also possible to choose the monomers in the polymerization steps and the post modification reaction in such a way, that a lower critical solution temperature (LCST) in water or water rich solvent mixtures is obtained for the final polymer or copolymer.

This means, that the polymer or copolymer shows a good solubility at low temperatures and a decreasing solubility at high temperatures. This effect is for example described by Hammouda, B.; Ho, D.; Kline, S in Macromolecules (2002), 35(22), 8578-8585).

The invention further relates to a method for producing a color filter, which comprises coating the color filter composition described above on a substrate, followed by exposure and development.

A "substrate" means any carrier material adapted to be coated with photoresist layers for the purpose of exposure. For this purpose frequently glass plates are used, which may be colored black or coated. Furthermore, plastic foils or metal foils that are already provided with a grating image, preferably in the form of an embossing, are suitable as substrates.

Examples of the coating of the photosensitive film include slit coating using a coating device having slit type nozzles, slit-and-spin coating that first coats using a nozzle and then coats using a spin coater, die coating, and curtain flow coating. Of these coating methods, the slit-and-spin coating is preferred. After the coating, the photosensitive resin composition may be prebaked to remove volatile ingredients such as solvents, thereby forming the photosensitive resin film containing substantially no volatile ingredient. The photosensitive resin film may have a thickness of about 1 to 10 μm.

Next, the photosensitive film is subjected to a first exposure through a mask. The mask has a pattern suitable for the function of the hardened resin pattern.

The photoresist resin film is then developed by puddle development, immersion development, or spray development. The development may be performed by using an alkaline aqueous solution. The alkaline aqueous solution contains an inorganic alkaline compound or an organic alkaline compound.

The invention further relates to the use of a dispersant as disclosed above in a color filter composition.

EXAMPLES

The following examples illustrate the invention.
Materials Use and their Abbreviations:
Monomers: butylacrylate (BA), hydroxyethylacrylate (HEA), hydroxypropylacrylate (HPA), 4-vinyl-pyridine (4-VP), styrene (S), dimethylaminopropyl methacrylate (DMAPMA)
Modification agents: cyclohexylacid anhydride (CHAA), succinic acid anhydride (SAA), methoxy-poly-ethyleneglycole (MPEG 550-OH), Lial 125 is a mixture of iso-$C_{12}$-$C_{15}$ alcohols, available from Condea
Solvents: methoxypropylacetate (MPA), Xylene, methoxypropanol (MP), polystyrene (PS), tetrahydrofurane (THF), polyethyleneoxide (POE/PEG), methoxytriglycol (MTG).
ATRP process: initiator is 2-bromoethylpropionate (MBP), the catalyst is CuBr/CuBr$_2$, the ligand is N,N,N',N'',N''-pentamethyldiethyltriamine (PMDETA).

NOR Initiator/regulator is compound O1

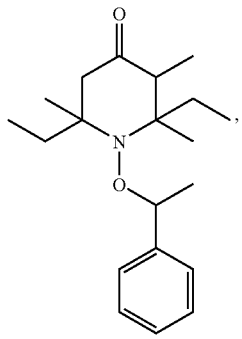

(O1)

which is prepared according to GB 2335190.

All other materials are commercially available and were used as received.

A) Preparation of Polymers and Copolymers

Example A1

Synthesis of a Linear Polymer Poly(BA)

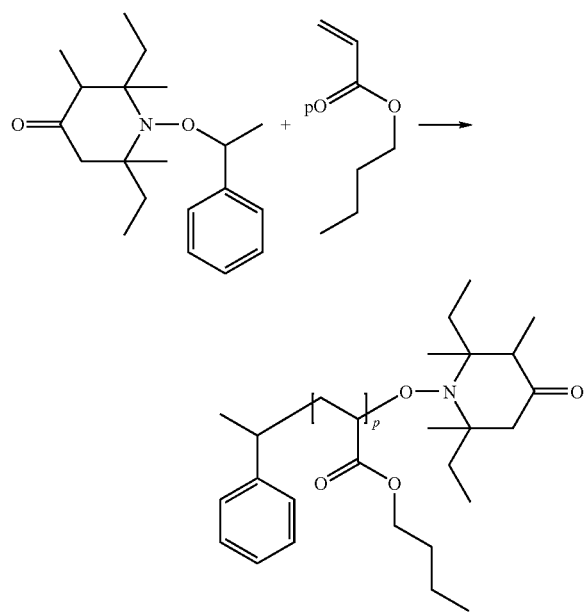

In a 3-necked 1000 ml round bottom flask with magnetic stirring bar, cooler, thermometer, dropping funnel 150.10 g n-butylacrylate (n-BA, 128.17 g/mol), 8.55 g compound O1 (317.48 g/mol) and 122.13 g of MPA were added, three times degassed with $N_2$/vacuum and polymerized at 135° C. under $N_2$ until a conversion of around 8 mol % is reached. 338.89 g of n-BA is slowly added to the reaction with the dropping funnel and polymerized at 135° C. under $N_2$ until a conversion of around 48 mol %. Residual monomers and solvents were distilled off at 80° C. and 12 mbar.

Yield 47%, GPC (THF, PS-Standard, Mn=7800 g/mol, PD=1.27), liquid.

According to analysis via $^1$H-NMR, the degree of polymerization is 75.

Example A2

Synthesis of a Linear Block Copolymer Poly(n-BA-b-4VP)

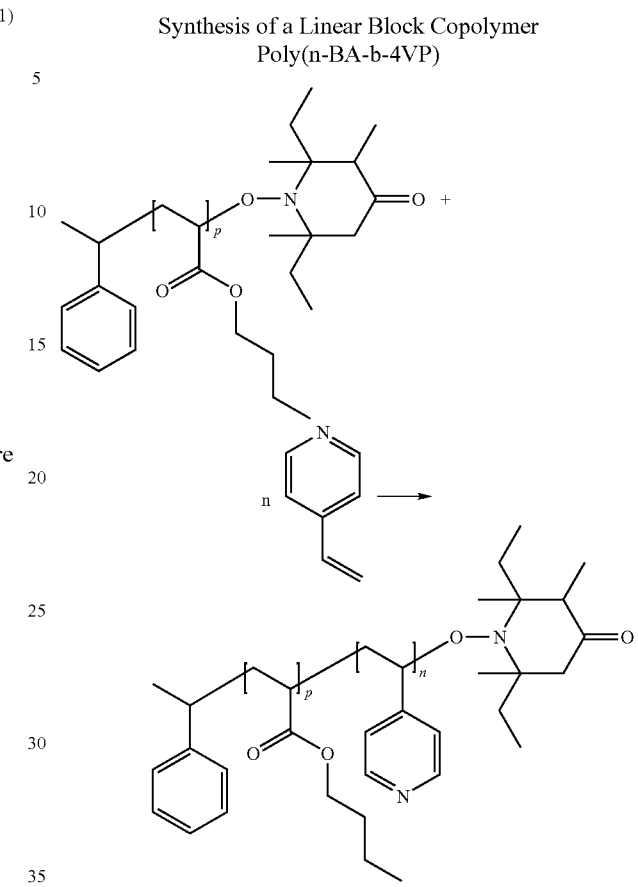

In a 3-necked 500 ml round bottom flask with magnetic stirring bar, cooler, thermometer 214.18 g poly(n-BA) of example A1, 70.90 g 4-vinylpyridine (4-VP, 105.14 g/mol) and 79.70 g of MPA are added, three times degassed with $N_2$/vacuum and polymerized at 125° C. under $N_2$ for 8 h. Residual monomers and solvents are distilled off at 80° C. and 12 mbar.

Yield 85%, GPC (THF, PS-Standard, Mn=8600 g/mol, PD=1.24), liquid.

According to analysis via $^1$H-NMR, the degree of polymerization is: P(BA-b-4VP)=75-b-14.

Example A3

Poly(n-BA-MPEGA-b-4-VP)

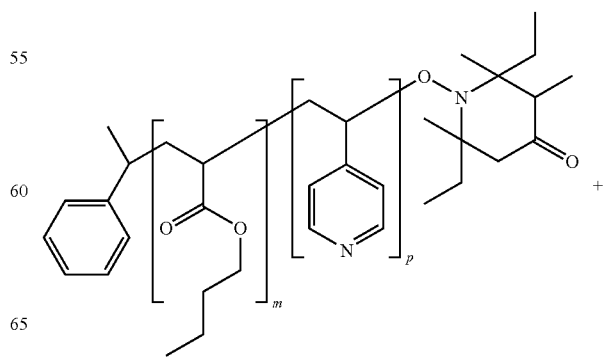

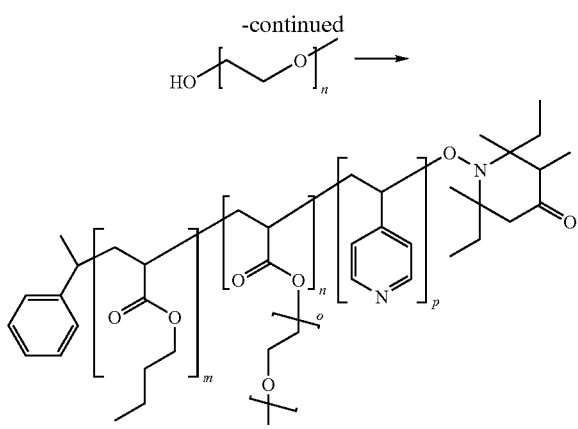

Transesterification Using MPEG-OH

In a 500 mL flask equipped with a magnetic stirring bar, distillation column with dry ice acetone cooling 92.8 g of Poly(n-BA-b-4-VP) according to example A2 in 107.2 g of Xylene and 114.7 g of MPEG-OH (Mn=550 g/mol) are added and dried by azeotropic distillation of the xylene. Three portions of 0.36 g of tera(isopropyl)orthotitanate are added during 3 h at 190-205° C. The formed n-Butanol is distilled of at low pressure.

187.7 g of Poly(n-BA-MPEGA-b-4-VP) are obtained. Mn=17500 g/mol, PDI=1.6, OH-value=0.05 meq/g. Analysis via GPC as well as 1H_NMR indicate almost quantitative conversion of the MPEG-OH.

The resulting polymer is well soluble in water and shows an LCST-type solution behaviour (LCST=lower critical solution temperature), i.e. the solubility of the polymer decreases with increasing temperature). A 35 wt % solution of the endproduct polymer in water is a clear solution at room temperature, but becomes turbid at elevated temperatures above 70° C.

The resulting polymer also formed clear 10 wt % solutions in following organic solvents: butyl acetate, methoxypropylacetate, methoxypropanol, butylglycol and xylene.

Example A4

Synthesis of a Linear Polymer Poly(BA)

In a 6 liter reactor equipped with stirrer, cooler, thermometer, and monomer feed pumps 1519 g n-Butylacrylate, 209 g compound O1 were added, three times degassed with $N_2$/vacuum and heated to 115° C. under $N_2$, where a continuous feed of n-butylacrylate was started over 4 hours and at the same time the reaction mass slowly heated to 135° C. After the end of the monomer feed, the reaction mass was further reacted for 5 h until a solids content of 55% was reached. Afterwards, the non reacted monomer was removed by vacuum distillation.

2812 g of Poly(n-BA) are obtained as liquid polymer, Mn=4554, PDI=1.18

According to analysis via $^1$H-NMR, the degree of polymerization is: P(nBA)=35.

Example A5

Synthesis of a Linear Block Copolymer Poly(n-BA-b-4VP)

In the same reactor as in Ex. A4, 2674 g of polymer A4 were loaded together with 1133 g 4-vinylpyridine and heated under $N_2$ to 135° C. and reacted for 3.5 h until a solids content of 91% was reached. This polymer was used for subsequent transesterifications without further removal of non-reacted 4-vinylpyridine.

3732 g of Polymer P(nBA-b-4VP) were isolated from the reactor, Mn=4779, PDI=1.19 According to analysis via $^1$H-NMR, the degree of polymerization is: P(nBA-b-4VP)=35-b-14.

Example A6

Synthesis of Block Copolymer Poly(n-BA-MPEGA-b-4-VP)

Transesterification Using MPEG-OH

In the same reactor as in example A4, 3730 g of the polymer A5 were loaded together with 3503 g of MPEG-OH (M=550 g/mol) and subjected to vacuum degassing at 130° C. for one hour to remove non-reacted 4-vinylpyridine. 12.0 g of LiOMe-solution (10 wt % lithium methanolate in methanol were added slowly and the transesterification started by distilling off n-Butanol at 130° C. and reduced pressure. Additional 5 portions of catalyst were added after every hour: 2×12.0 g and additional 3×14.5 g of LiOMe-solution. After 6 h the reaction was completed by collecting the calculated amount of n-butanol.

6322 g of viscous polymer were obtained; Mn=8829, PDI=1.36

Analysis via GPC as well as 1H_NMR indicate almost quantitative conversion of the MPEG-OH.

According to analysis via $^1$H-NMR, the degree of polymerization is: P[(nBA-MPEGA)-b-4VP]=(23-12)-b-14.
OH-number titration: 0.20 meq/g
Amine number titration: 69 mg KOH/g
The 50 wt % solids solution in water displays an LCST of 67° C.

Aside from water, the polymer A6 gives clear solutions 10 wt % in following organic solvents: butyl acetate, methoxypropylacetate, methoxypropanol, butylglycol and xylene.

For testing as pigment dispersant part of the polymer A6 was dissolved in water to give a clear 50 wt % solids solution, other parts of the polymer were dissolved in various other organic solvents.

Example A7

Synthesis of a Random Copolymer Poly(n-BA-MPEGA)

In the same reactor as in example A4 were loaded 500 g of a poly(n-BA) (Mn=8304, PDI=1.21), which was made analog polymer A4 and 500 g of MPEG-OH (M=550 g/mol). The mixture was heated to 128° C., than 21 g of LiOMe catalysts solution (10 wt % in methanol) were added slowly and n-butanol was slowly distilled off under reduced pressure. Catalyst addition was repeated 5 times each after one hour with 21 g catalyst solution. The transesterification was conducted in total for 6 h until the calculated amount of n-butanol had been distilled off.

918 g of polymer were obtained; Mn=13305, PDI=1.31

Analysis via GPC as well as 1H_NMR indicate almost quantitative conversion of the MPEG-OH.

According to analysis via $^1$H-NMR, the degree of polymerization is: P(nBA-MPEGA)=(58-19).

The 50 wt % solids solution in water displays an LCST of 70° C.

For testing as pigment dispersant part of the polymer A7 was dissolved in water to give a clear 50 wt % solids solution.

Example A8

Synthesis of a Random Copolymer Poly(n-BA-MPEGA) Comprising Different MPEG-OH: MPEG350. MPEG500. MPEG2000

In a 250 mL flask equipped with a magnetic stirring bar and distillation column are loaded 65 g of a P(nBA) (Mn=8386, PD=1.21; made analog to example A4), 7.5 g of MPEG-OH (M=350), 7.5 g MPEG-OH (M=500) and 20 g MPEG-OH (M=2000). The mixture was heated to 125° C. and 2 g of LiOMe catalyst solution (10 wt % in MeOH) were slowly added. The transesterification was started by slowly distilling off n-butanol under reduced pressure and increasing the temperature to 130° C. Two additional portions each of 2 g catalyst solution were added after 1 h and 2 h later. After 4 h total reaction time the transesterification was terminated after the calculated amount of n-butanol had been distilled off.

84 g of polymer were obtained; Mn=10490, PDI=1.61

Analysis via GPC as well as $^1$H-NMR indicate almost quantitative conversion of the MPEG-OH-mixture.

According to analysis via $^1$H-NMR, the degree of polymerization is: P(nBA-MPEGA-mix)=(69-7).

Example A9

Synthesis of a Random Copolymer Poly(n-BA-MPEGA) Comprising Different MPEG-OH: MPEG350. MPEG500. MPEG5000

In a 250 mL flask equipped with a magnetic stirring bar and distillation column are loaded 65 g of a P(nBA) (Mn=8386, PD=1.21; made analog to example A4), 7.5 g of MPEG-OH (M=350), 7.5 g MPEG-OH (M=500) and 20 g MPEG-OH (M=5000). The mixture was heated to 125° C. and 2 g of LiOMe catalyst solution (10 wt % in MeOH) were slowly added. The transesterification was started by slowly distilling off n-butanol under reduced pressure and increasing the temperature to 130° C. Two additional portions each of 2 g catalyst solution were added after 1 h and 2 h later. After 4 h total reaction time the transesterification was terminated after the calculated amount of n-butanol had been distilled off.

83 g of polymer were obtained; Mn=9563, PDI=1.75

Analysis via GPC as well as $^1$H-NMR indicate almost quantitative conversion of the MPEG-OH-mixture.

According to analysis via $^1$H-NMR, the degree of polymerization is: P(nBA-MPEGA-mix)=(71-6).

Example A10

Synthesis of a Random Copolymer Poly(n-BA-MPEGA-OleA) Comprising Unsaturated Groups In a 250 mL flask equipped with a magnetic stirring bar and distillation column are loaded 38 g of a P(nBA) (Mn=8386, PD=1.21; made analog to example A4), 35 g MPEG-OH (M=500) and 27 g oleyl alcohol (techn. grade). The mixture was heated to 125° C. and 2 g of LiOMe catalyst solution (10 wt % in MeOH) were slowly added. The transesterification was started by slowly distilling off n-butanol under reduced pressure and increasing the temperature to 135° C. Two additional portions each of 2 g catalyst solution were added after 1 h and 2 h later. After 4 h total reaction time the transesterification was terminated after the calculated amount of n-butanol had been distilled off. 78 g of liquid polymer were obtained; Mn=13374, PDI=1.87

Analysis via GPC as well as $^1$H-NMR indicate almost quantitative conversion of the MPEG-OH and the unsaturated oleyl alcohol.

According to analysis via $^1$H-NMR, the degree of polymerization is: P(nBA-MPEGA-OleA)=(32-18-26).

Example A11

Synthesis of a Non-Polar Block Copolymer Poly[(n-BA-iC12-15A)-b-4VP]

In a 250 ml flask equipped with a magnetic stirring bar and distillation column are loaded 83.3 g of a 60 wt % MPA-solution of a diblock copolymer P(nBA-b-4VP) (synthesized analog polymer A5; degree of polymerization=76-b-14, Mn=8834, PD=1.27) and 54.1 g of a branched iso-C12-15-alcohol mixture (Lial 125, Condea). After heating the mixture to 125° C., the MPA was distilled under reduced pressure before adding 0.28 g catalyst solution (Ti(AcAc)$_2$(iOPr)$_2$ Titan-bis-acetylacetonato-bis-isopropylate, 75 wt % in isopropanol). The transesterification was started by slowly distilling off n-Butanol under reduced pressure and increasing the temperature to 145° C. Two additional portions each of 0.28 g catalyst solution were added after 1 h and 2 h later. After 4 h total reaction time the transesterification was terminated after no further n-butanol formation was observed.

76 g of liquid block copolymer were obtained; Mn=12216, PDI=1.27

Analysis via GPC as well as $^1$H-NMR indicated almost quantitative conversion of the MPEG-OH and the branched iC12-C15-alcohol.

According to combined analysis of $^1$H-NMR and GPC, the degree of polymerization is: P[(nBA-iC12-15A)-b-4VP]= (16-60)-b-14.

Example A12

Synthesis of a Block Copolymer Poly(n-BA-b-S)

In a 500 ml flask equipped with a magnetic stirring bar and distillation column are loaded 210 g of a P(nBA) (synthesized analog polymer A4; degree of polymerization=76, Mn=8547, PDI=1.19) and 90 g of styrene and were heated under N2 to 125° C. After 5 h the reaction was terminated and the non-reacted styrene was distilled off at reduced pressure.

175 g of block copolymer were obtained; Mn=11828, PDI=1.21

According to analysis of $^1$H-NMR the degree of polymerization is: P(nBA-b-S)=(75-b-40).

The resultant very high viscous block copolymer was diluted with MPA to a clear 60 wt % solution.

Example A13

Synthesis of a Non-Polar Block Copolymer Poly[(n-BA-iC12-15A)-b-S]

In a 250 ml flask equipped with a magnetic stirring bar and distillation column are loaded 50 g of a 60 wt % MPA-solution of the diblock copolymer A12 P(nBA-b-S)=75-b-40) and 26.3 g of a branched iso-C12-15-alcohol mixture (Lial 125, Condea). After heating the mixture to 125° C., the MPA was distilled off under reduced pressure before adding 0.15 g catalyst solution (Ti(AcAc)$_2$(iOPr)$_2$ Titan-bis-acetylacetonato-bis-isopropylate, 75 wt % in isopropanol). The transesterification was started by slowly distilling off n-Butanol under reduced pressure and increasing the temperature to 145° C. Two additional portions each of 0.15 g catalyst solution were added after 2 h and 4 h later. After 6 h total reaction time the reaction was terminated after no further n-butanol formation was observed.

49 g of liquid block copolymer were obtained; Mn=15072, PDI=1.21

Analysis via GPC as well as $^1$H-NMR indicated good conversion of the branched iC12-C15-alcohol.

According to combined analysis of $^1$H-NMR and GPC, the degree of polymerization is: P[(nBA-iC12-15A)-b-S=(15-60)-b-40.

Example A14

Synthesis of a Block Copolymer
Poly(n-BA-b-DMAPMA)

In a 500 ml flask equipped with a magnetic stirring bar and distillation column are loaded 150 g of a P(nBA) (synthesized analog polymer A4; degree of polymerization=76, Mn=8547, PDI=1.19) and 150 g of dimethylaminopropyl methacrylamide (DMAPMA) and were heated under N2 to 145° C. After 4.5 h the reaction was terminated and non-reacted monomer DMAPMA was distilled off at high vacuum.

179 g of block copolymer were isolated; Mn=6874, PDI=1.41 (the apparent molecular weight via GPC appeared lower than the starting precursor)

According to analysis of $^1$H-NMR the degree of polymerization is: P(nBA-b-DMAPMA)=(75-b-23).

The resultant high viscous block copolymer was diluted with MPA to a clear 60 wt % solution.

Example A15

Synthesis of Block Copolymer
Poly(n-BA-MPEGA-b-DMAPMA)

Transesterification Using MPEG-OH 50 g of the polymer Poly(n-BA-b-DMAPMA) (synthesized according to polymer A14) are loaded together with 50 g of MPEG-OH (M=550 g/mol) and subjected to vacuum degassing at 130° C. for one hour to remove non-reacted DMAPMA. 2 g of LiOMe-solution (10 wt % lithium methanolate in methanol are added slowly and the transesterification started by distilling off n-Butanol at 130° C. and reduced pressure. Catalyst addition is repeated 2 times each after one hour with 2 g catalyst solution. The transesterification is conducted in total for 3 h until the calculated amount of n-butanol had been distilled off.

100 g of polymer are obtained; Mn=112449, PDI=1.79

Analysis via GPC as well as 1H_NMR indicate almost quantitative conversion of the MPEG-OH.

According to combined analysis of $^1$H-NMR and GPC, the degree of polymerization is: P[(nBA-MPEG)-b-DMAPMA]=(51-14)-b-14.

Example A16

Synthesis of a Random Copolymer
Poly(n-BA-MPEGA-b-DMAPMA) Comprising
Different MPEG-OH: MTG, MPEG500

In a 200 ml flask equipped with a magnetic stirring bar and distillation column are loaded 35 g of a Poly(n-BA-b-DMAPMA) (synthesized according to polymer A14), 15 g of MTG (M=164.2), 50 g MPEG-OH (M=500). The mixture is heated to 80° C. and 2 g of LiOMe catalyst solution (10 wt % in MeOH) are slowly added. The transesterification is started by slowly distilling off n-butanol under reduced pressure and increasing the temperature to 120° C. Two additional portions each of 2 g catalyst solution are added after 1 h and 2 h later. After 3 h total reaction time the transesterification is terminated after the calculated amount of n-butanol had been distilled off.

100 g of polymer are obtained; Mn=11265, PDI=1.69

Analysis via GPC as well as $^1$H-NMR indicate almost quantitative conversion of the MPEG-OH-mixture.

According to analysis via $^1$H-NMR, the degree of polymerization is: P[(nBA-MPEG500A-MTGA)-b-DMAPMA]=(37-20-19)-b-14.

Example A17

Synthesis of a Random Copolymer
Poly(n-BA-MPEGA-b-DMAPMA) Comprising
Different MPEG-OH: MTG, MPEG500

In a 200 ml flask equipped with a magnetic stirring bar and distillation column are loaded 40 g of a Poly(n-BA-b-DMAPMA) (synthesized according to polymer A14), 20 g of MTG (M=164.2), 40 g MPEG-OH (M=500). The mixture is heated to 80° C. and 2 g of LiOMe catalyst solution (10 wt % in MeOH) are slowly added. The transesterification is started by slowly distilling off n-butanol under reduced pressure and increasing the temperature to 120° C. Two additional portions each of 2 g catalyst solution are added after 1 h and 2 h later. After 3 h total reaction time the transesterification is terminated after the calculated amount of n-butanol had been distilled off.

103 g of polymer are obtained; Mn=, PDI=

Analysis via GPC as well as $^1$H-NMR indicate almost quantitative conversion of the MPEG-OH-mixture.

According to analysis via $^1$H-NMR, the degree of polymerization is: P[(nBA-MPEG500A-MTGA)-b-DMAPMA]=(40-14-22)-b-14.

Example A18

Synthesis of a Random Copolymer
Poly(n-BA-MPEGA-b-DMAPMA) Comprising
Different MPEG-OH: MTG, MPEG500

In a 200 ml flask equipped with a magnetic stirring bar and distillation column are loaded 40 g of a Poly(n-BA-b-DMAPMA) (synthesized according polymer A14), 30 g of MTG (M=164.2), 30 g MPEG-OH (M=500). The mixture is heated to 80° C. and 2 g of LiOMe catalyst solution (10 wt % in MeOH) are slowly added. The transesterification is started by slowly distilling off n-butanol under reduced pressure and increasing the temperature to 120° C. Two additional portions each of 2 g catalyst solution are added after 1 h and 2 h later. After 3 h total reaction time the transesterification is terminated after the calculated amount of n-butanol had been distilled off.

100 g of polymer are obtained; Mn=, PDI=

Analysis via GPC as well as $^1$H-NMR indicate almost quantitative conversion of the MPEG-OH-mixture.

According to analysis via $^1$H-NMR, the degree of polymerization is: P[(nBA-MPEG500A-MTGA)-b-DMAPMA]=(33-11-33)-b-14.

Example A19

Synthesis of Block Copolymer
Poly(n-BA-MPEGA-b-DMAPMA)
Transesterification Using MPEG-OH In the reactor, 121.5 g of Poly(n-BA-b-DMAPMA) (synthesized according to polymer A14) are loaded together with 49.8 g of MPEG-OH (M=550 g/mol) and subjected to vacuum degassing at 130° C. for one hour to remove non-reacted DMAPMA. 0.33 g of LiOMe-solution (10 wt % lithium methanolate in methanol are added slowly and the transesterification started by distilling off n-Butanol at 130° C. and reduced pressure. Catalyst addition is repeated 3 times each after one hour with 0.33 g catalyst solution. The transesterification is conducted in total for 6 h until the calculated amount of n-butanol had been distilled off.

166 g of polymer are obtained; Mn=6972, PDI=2.12

Analysis via GPC as well as 1H_NMR indicate almost quantitative conversion of the MPEG-OH.

According to combined analysis of $^1$H-NMR and GPC, the degree of polymerization is: P[(nBA-MPEGA)-b-DMAPMA]=(62-15)-b-16.

Example A20

Synthesis of Block Copolymer
Poly(n-BA-MPEGA-b-DMAPMA)
Transesterification Using MPEG-OH In the reactor, 109.2 g of Poly(n-BA-b-DMAPMA) (synthesized according to polymer A14) are loaded together with 44.7 g of MPEG-OH (M=550 g/mol) and subjected to vacuum degassing at 130° C. for one hour to remove non-reacted DMAPMA. 1.19 g of catalyst solution (Ti(AcAc)2 (iOPr)2 Titan-bis-acetylacetonato-bis-isopropylate, 75 wt % in isopropanol) are added slowly and the transesterification started by distilling off n-Butanol at 165° C. and reduced pressure. Catalyst addition is repeated 2.5 times each after one hour with 1.19 g catalyst solution. The transesterification is conducted in total for 3.5 h until the calculated amount of n-butanol had been distilled off.

149 g of polymer are obtained; Mn=8498, PDI=2.40.

Analysis via GPC as well as 1H_NMR indicate almost quantitative conversion of the MPEG-OH.

According to combined analysis of $^1$H-NMR and GPC, the degree of polymerization is: P[(nBA-MPEGA)-b-DMAPMA]=(65-12)-b-16.

Example A21

Synthesis of Block Copolymer
Poly(n-BA-MPEGA-b-DMAPMA)
Transesterification Using MPEG-OH In the reactor, 102.3 g of Poly(n-BA-b-DMAPMA) (synthesized according to polymer A14) are loaded together with 65.2 g of MPEG-OH (M=550 g/mol) and subjected to vacuum degassing at 160° C. for one hour to remove non-reacted DMAPMA. 0.43 g of catalyst solution (Ti(AcAc)2 (iOPr)2 Titan-bis-acetylacetonato-bis-isopropylate, 75 wt % in isopropanol) are added slowly and the transesterification started by distilling off n-Butanol at 165° C. and reduced pressure. Catalyst addition is repeated 4 times each after one hour with 0.43 g catalyst solution. The transesterification is conducted in total for 5 h until the calculated amount of n-butanol had been distilled off.

163 g of polymer are obtained; Mn=8364, PDI=1.62

Analysis via GPC as well as 1H_NMR indicate almost quantitative conversion of the MPEG-OH.

According to combined analysis of $^1$H-NMR and GPC, the degree of polymerization is: P[(nBA-MPEG)-b-DMAPMA]=(60-17)-b-16.

Example A22

Synthesis of Block Copolymer
Poly(n-BA-MPEGA-b-DMAPMA)
Transesterification Using MPEG-OH In the reactor, 102.6 g of Poly(n-BA-b-DMAPMA) (synthesized according to polymer A14) are loaded together with 98.1 g of MPEG-OH (M=550 g/mol) and subjected to vacuum degassing at 160° C. for one hour to remove non-reacted DMAPMA. 0.52 g of catalyst solution (Ti(AcAc)2 (iOPr)2 Titan-bis-acetylacetonato-bis-isopropylate, 75 wt % in isopropanol) are added slowly and the transesterification started by distilling off n-Butanol at 165° C. and reduced pressure. Catalyst addition is repeated 4 times each after one hour with 0.52 g catalyst solution. The transesterification is conducted in total for 5 h until the calculated amount of n-butanol had been distilled off.

196 g of polymer are obtained; Mn=9060, PDI=1.66

Anaylsis via GPC as well as 1H_NMR indicate almost quantitative conversion of the MPEG-OH.

According to combined analysis of $^1$H-NMR and GPC, the degree of polymerization is: P[(nBA-MPEG)-b-DMAPMA]=(51-26)-b-16.

Example A23

Synthesis of Block Copolymer
Poly(n-BA-MPEGA-b-DMAPMA)
Transesterification Using MPEG-OH In the reactor, 71.2 g of Poly(n-BA-b-DMAPMA) (synthesized according to polymer A14) are loaded together with 102.1 g of MPEG-OH (M=550 g/mol) and subjected to vacuum degassing at 160° C. for one hour to remove non-reacted DMAPMA. 0.6 g of catalyst solution (Ti(AcAc)2 (iOPr)2 Titan-bis-acetylacetonato-bis-isopropylate, 75 wt % in isopropanol) are added slowly and the transesterification started by distilling off n-Butanol at 165° C. and reduced pressure. Catalyst addition is repeated 4 times each after one hour with 0.6 g catalyst solution. The transesterification is conducted in total for 5 h until the calculated amount of n-butanol had been distilled off.

170.2 g of polymer are obtained; Mn=10053, PDI=1.71

Anaylsis via GPC as well as 1H_NMR indicate almost quantitative conversion of the MPEG-OH.

According to combined analysis of $^1$H-NMR and GPC, the degree of polymerization is: P[(nBA-MPEG)-b-DMAPMA]=(39-38)-b-16.

Example A24

Synthesis of Block Copolymer
Poly(n-BA-MPEGA-b-DMAPMA)
Transesterification Using MPEG-OH In the reactor, 54 g of Poly(n-BA-b-DMAPMA) (synthesized according to polymer A14) are loaded together with 120.5 g of MPEG-OH (M=550 g/mol) and subjected to vacuum degassing at 160° C. for one hour to remove non-reacted DMAPMA. 2.75 g of catalyst solution (Ti(AcAc)2 (iOPr)2 Titan-bis-acetylacetonato-bis-isopropylate, 75 wt % in isopropanol) are added slowly and the transesterification started by distilling off n-Butanol at 165° C. and reduced pressure. Catalyst addition is repeated 2 times each after 1 hour with 1.38 and 2.75 g catalyst solution. The transesterification is conducted in total for 6 h until the calculated amount of n-butanol had been distilled off.

172 g of polymer are obtained; Mn=11051, PDI=1.72

Analysis via GPC as well as 1H_NMR indicate almost quantitative conversion of the MPEG-OH.

According to combined analysis of $^1$H-NMR and GPC, the degree of polymerization is: P[(nBA-MPEG)-b-DMAPMA]=(23-54)-b-16.

Example A25

Synthesis of a Block Copolymer Poly (n-BA-MPEGA-iC12-15A)-b-DMAPMA) Transesterification Using MPEG-OH and Lial 125

In a 250 ml flask equipped with a magnetic stirring bar and distillation column are loaded 75 g of a Poly(n-BA-b-DMAPMA) (synthesized according to polymer A14), 36.2 g MPEG-OH (M=500) and 12.1 g Lial 125 (techn. grade). The mixture is heated to 130° C. and 2.4 g of LiOMe catalyst solution (10 wt % in MeOH) are slowly added. The transesterification is started by slowly distilling off n-butanol under reduced pressure and increasing the temperature to 125° C. Two additional portions each of 2.4 g catalyst solution are added after 1 h and 1 h later. After 3 h total reaction time the transesterification is terminated after the calculated amount of n-butanol had been distilled off.

120.5 g of liquid polymer are obtained; Mn=8637, PDI=1.92

Analysis via GPC as well as $^1$H-NMR indicate almost quantitative conversion of the MPEG-OH and Lial 125.

According to analysis via $^1$H-NMR, the degree of polymerization is: P(n-BA-MPEGA-iC12-15A)-b-DMAPMA=(53-13-10)-14.

Example A26

Synthesis of a Block Copolymer Poly (n-BA-MPEGA-iC12-15A)-b-DMAPMA) Transesterification Using MPEG-OH and Lial 125

In a 250 ml flask equipped with a magnetic stirring bar and distillation column are loaded 70.1 g of a Poly(n-BA-b-DMAPMA) (synthesized according to polymer A14), 22.5 g MPEG-OH (M=500) and 22.5 g Lial 125 (techn. grade). The mixture is heated to 130° C. and 2.25 g of LiOMe catalyst solution (10 wt % in MeOH) are slowly added. The transesterification is started by slowly distilling off n-butanol under reduced pressure and increasing the temperature to 125° C. Two additional portions each of 2.25 g catalyst solution are added after 1 h and 1 h later. After 4 h total reaction time the transesterification is terminated after the calculated amount of n-butanol had been distilled off.

112.6 g of liquid polymer are obtained; Mn=8382, PDI=1.92

Analysis via GPC as well as $^1$H-NMR indicate almost quantitative conversion of the MPEG-OH and Lial 125.

According to analysis via $^1$H-NMR, the degree of polymerization is: P(n-BA-MPEGA-iC12-15A)-b-DMAPMA=(47-10-19)-14.

Example A27

Synthesis of a block copolymer Poly (n-BA-MPEGA-iC12-15A)-b-DMAPMA) Transesterification Using MPEG-OH and Lial 125

In a 250 ml flask equipped with a magnetic stirring bar and distillation column are loaded 72 g of a Poly(n-BA-b-DMAPMA) (synthesized according to polymer A14), 11.6 g MPEG-OH (M=500) and 34.7 g Lial 125 (techn. grade). The mixture is heated to 130° C. and 2.31 g of LiOMe catalyst solution (10 wt % in MeOH) are slowly added. The transesterification is started by slowly distilling off n-butanol under reduced pressure and increasing the temperature to 125° C. Two additional portions each of 2.31 g catalyst solution are added after 1 h and 1 h later. After 4 h total reaction time the transesterification is terminated after the calculated amount of n-butanol had been distilled off.

115 g of liquid polymer are obtained; Mn=9488, PDI=1.77

Analysis via GPC as well as $^1$H-NMR indicate almost quantitative conversion of the MPEG-OH and Lial 125.

According to analysis via $^1$H-NMR, the degree of polymerization is: P(n-BA-MPEGA-iC12-15A)-b-DMAPMA=(54-2-20)-14.

Example A28

Synthesis of a Block Copolymer Poly (n-BA-iC12-15A)-b-DMAPMA) Transesterification Using Lial 125

In a 250 ml flask equipped with a magnetic stirring bar and distillation column are loaded 89.8 g of a Poly(n-BA-b-DMAPMA) (synthesized according to polymer A14), 57.7 g Lial 125 (techn. grade). The mixture is heated to 130° C. and 2.9 g of LiOMe catalyst solution (10 wt % in MeOH) are slowly added. The transesterification is started by slowly distilling off n-butanol under reduced pressure and increasing the temperature to 125° C. Two additional portions each of 2.9 g catalyst solution are added after 1 h and 1 h later. After 3 h total reaction time the transesterification is terminated after the calculated amount of n-butanol had been distilled off.

144 g of liquid polymer are obtained; Mn=10215, PDI=1.70

Analysis via GPC as well as $^1$H-NMR indicate almost quantitative conversion of the Lial 125.

According to analysis via $^1$H-NMR, the degree of polymerization is: P(n-BA-iC12-15A)-b-DMAPMA=(52-24)-14.

Example A29

Synthesis of a Block Copolymer Poly (n-BA-MPEGA-iC12-15A)-b-DMAPMA) Transesterification Using MPEG-OH and Lial 125

In a 250 ml flask equipped with a magnetic stirring bar and distillation column are loaded 535.5 g of a Poly(n-BA-b-DMAPMA) (synthesized according to polymer A14), 84.8 g MPEG-OH (M=500) and 254.4 g Lial 125 (techn. grade). The mixture is heated to 140° C. and 5.5 g of LiOMe catalyst solution (10 wt % in MeOH) are slowly added. The transesterification is started by slowly distilling off n-butanol under reduced pressure and increasing the temperature to 140° C. Two additional portions each of 5.5 g catalyst solution are added after 1 h and 1 h later. After 3 h total reaction time the transesterification is terminated after the calculated amount of n-butanol had been distilled off.

751 g of liquid polymer are obtained; Mn=9488, PDI=1.77

Analysis via GPC as well as $^1$H-NMR indicate almost quantitative conversion of the MPEG-OH and Lial 125.

According to analysis via $^1$H-NMR, the degree of polymerization is: P(n-BA-MPEGA-iC12-15A)-b-DMAPMA=(52-4-23)-21.

Example A30

Synthesis of a Block Copolymer Poly (n-BA-MPEGA-iC12-15A)-b-DMAPMA) Transesterification Using MPEG-OH and Lial 125

In a 250 ml flask equipped with a magnetic stirring bar and distillation column are loaded 577.5 g of a Poly(n-BA-b-DMAPMA) (synthesized according to polymer A14), 91.4 g MPEG-OH (M=500) and 274.3 g Lial 125 (techn. grade). The mixture is heated to 140° C. and 7.4 g of catalyst solution (Ti(AcAc)2(iOPr)2 Titan-bis-acetylacetonato-bis-isopropylate, 75 wt % in isopropanol) are added slowly and the transesterification started by distilling off n-Butanol at 150° C. and reduced pressure. Two additional portions each of 7.4 g catalyst solution are added after 1 h and 1 h later. After 3 h total reaction time the transesterification is terminated after the calculated amount of n-butanol had been distilled off.

826 g of liquid polymer are obtained; Mn=9488, PDI=1.77

Analysis via GPC as well as $^1$H-NMR indicate almost quantitative conversion of the MPEG-OH and Lial 125.

According to analysis via $^1$H-NMR, the degree of polymerization is: P(n-BA-MPEGA-iC12-15A)-b-DMAPMA=(52-4-23)-21.

Example A31

Synthesis of a Block Copolymer Poly (n-BA-MPEGA-iC12-15A)-b-DMAPMA) Transesterification Using MPEG-OH and Lial 125

In a 250 ml flask equipped with a magnetic stirring bar and distillation column are loaded 151.4 g of a Poly(n-BA-b-DMAPMA) (synthesized according to polymer A14), 101.0 g MPEG-OH (M=500). The mixture is heated to 130° C. and 2.04 g of catalyst solution (Ti(AcAc)2(iOPr)2 Titan-bis-acetylacetonato-bis-isopropylate, 75 wt % in isopropanol) are added slowly and the transesterification started by distilling off n-Butanol at 155° C. and reduced pressure. Two additional portions each of 2.04 g catalyst solution are added after 1 h and 1 h later. After 3 h total reaction time the transesterification is terminated after the calculated amount of n-butanol had been distilled off.

238.1 g of liquid polymer are obtained; Mn=7417, PDI=1.51

Analysis via GPC as well as $^1$H-NMR indicate almost quantitative conversion of the MPEG-OH.

According to analysis via $^1$H-NMR, the degree of polymerization is: P(n-BA-MPEGA-iC12-15A)-b-DMAPMA=(62-15)-17.

Example A32

Synthesis of a Block Copolymer Poly (n-BA-MPEGA-iC12-15A)-b-DMAPMA) Transesterification Using MPEG-OH and Lial 125

In a 250 ml flask equipped with a magnetic stirring bar and distillation column are loaded 150 g of a Poly(n-BA-b-DMAPMA) (synthesized according to polymer A14), 75 g MPEG-OH (M=500) and 25 g Lial 125 (techn. grade). The mixture is heated to 150° C. and 2.02 g of catalyst solution (Ti(AcAc)2(iOPr)2 Titan-bis-acetylacetonato-bis-isopropylate, 75 wt % in isopropanol) are added slowly and the transesterification started by distilling off n-Butanol at 155° C. and reduced pressure. Two additional portions each of 2.02 g catalyst solution are added after 1 h and 1 h later. After 3 h total reaction time the transesterification is terminated after the calculated amount of n-butanol had been distilled off.

235.8 g of liquid polymer are obtained; Mn=7585, PDI=1.53

Analysis via GPC as well as $^1$H-NMR indicate almost quantitative conversion of the MPEG-OH and Lial 125.

According to analysis via $^1$H-NMR, the degree of polymerization is: P(n-BA-MPEGA-iC12-15A)-b-DMAPMA=(54-13-9)-17.

Example A33

Synthesis of a Block Copolymer Poly (n-BA-MPEGA-iC12-15A)-b-DMAPMA) Transesterification Using MPEG-OH and Lial 125

In a 250 ml flask equipped with a magnetic stirring bar and distillation column are loaded 150 g of a Poly(n-BA-b-DMAPMA) (synthesized according to polymer A14), 50 g MPEG-OH (M=500) and 50 g Lial 125 (techn. grade). The mixture is heated to 150° C. and 2.02 g of catalyst solution (Ti(AcAc)2(iOPr)2 Titan-bis-acetylacetonato-bis-isopropylate, 75 wt % in isopropanol) are added slowly and the transesterification started by distilling off n-Butanol at 155° C. and reduced pressure. Two additional portions each of 2.02 g catalyst solution are added after 1 h and 1 h later. After 3 h total reaction time the transesterification is terminated after the calculated amount of n-butanol had been distilled off.

235.8 g of liquid polymer are obtained; Mn=7574, PDI=1.48

Analysis via GPC as well as $^1$H-NMR indicate almost quantitative conversion of the MPEG-OH and Lial 125.

According to analysis via $^1$H-NMR, the degree of polymerization is: P(n-BA-MPEGA-iC12-15A)-b-DMAPMA=(51-8-17)-17.

Example A34

Synthesis of a Block Copolymer Poly (n-BA-MPEGA-iC12-15A)-b-DMAPMA) Transesterification Using MPEG-OH and Lial 125

In a 250 ml flask equipped with a magnetic stirring bar and distillation column are loaded 153.7 g of a Poly(n-BA-b-DMAPMA) (synthesized according to polymer A14), 25.6 g MPEG-OH (M=500) and 76.8 g Lial 125 (techn. grade). The mixture is heated to 150° C. and 2.07 g of catalyst solution (Ti(AcAc)2(iOPr)2 Titan-bis-acetylacetonato-bis-isopropylate, 75 wt % in isopropanol) are added slowly and the transesterification started by distilling off n-Butanol at 155° C. and reduced pressure. Two additional portions each of 2.07 g catalyst solution are added after 1 h and 1 h later. After 3 h total reaction time the transesterification is terminated after the calculated amount of n-butanol had been distilled off.

241.6 g of liquid polymer are obtained; Mn=7260, PDI=1.54

Analysis via GPC as well as $^1$H-NMR indicate almost quantitative conversion of the MPEG-OH and Lial 125.

According to analysis via $^1$H-NMR, the degree of polymerization is: P(n-BA-MPEGA-iC2-15A)-b-DMAPMA=(48-3-25)-17.

Example A35

Synthesis of a Block Copolymer Poly (n-BA-MPEGA-iC2-15A)-b-DMAPMA) Transesterification Using MPEG-OH and Lial 125

In a 250 ml flask equipped with a magnetic stirring bar and distillation column are loaded 152.7 g of a Poly(n-BA-b-DMAPMA) (synthesized according to polymer A14), 101.8 g Lial 125 (techn. grade). The mixture is heated to 130° C. and 2.06 g of catalyst solution (Ti(AcAc)2(iOPr)2 Titan-bis-acetylacetonato-bis-isopropylate, 75 wt % in isopropanol) are added slowly and the transesterification started by distilling off n-Butanol at 150° C. and reduced pressure. Two additional portions each of 2.06 g catalyst solution are added after 1 h and 1 h later. After 3 h total reaction time the transesterification is terminated after the calculated amount of n-butanol had been distilled off.

240.1 g of liquid polymer are obtained; Mn=6766, PDI=1.58

Analysis via GPC as well as $^1$H-NMR indicate almost quantitative conversion of Lial 125.

According to analysis via $^1$H-NMR, the degree of polymerization is: P(n-BA-iC12-15A)-b-DMAPMA=(46-30)-17.

Example A36

Synthesis of a Block Copolymer Poly (n-BA-MPEGA-iC12-15A)-b-DMAPMA) Transesterification using MPEG-OH and Lial 125

In a 250 mL flask equipped with a magnetic stirring bar and distillation column are loaded 152.7 g of a Poly(n-BA-b-DMAPMA) (synthesized analog polymer A14), 101.8 g Lial 125 (techn. grade). The mixture is heated to 130° C. and 2.06 g of catalyst solution (Ti(AcAc)2(iOPr)2 Titan-bis-acetylacetonato-bis-isopropylate, 75 wt % in isopropanol) are added slowly and the transesterification started by distilling off n-Butanol at 150° C. and reduced pressure. Two additional portions each of 2.06 g catalyst solution are added after 1 h and 1 h later. After 3 h total reaction time the transesterification is terminated after the calculated amount of n-butanol had been distilled off.

240.1 g of liquid polymer are obtained; Mn=6766, PDI=1.58

Analysis via GPC as well as $^1$H-NMR indicate almost quantitative conversion of Lial 125.

According to analysis via $^1$H-NMR, the degree of polymerization is: P(n-BA-iC12-15A)-b-DMAPMA=(46-30)-17.

Synthesis of a Block Copolymer Poly(n-BA-MPEGA-iC12-15A)-b-(DMAPMA-ClBnDMAPMA) Quaternization In a 100 ml flask equipped with a magnetic stirring bar and distillation column are loaded 15 g of a Poly (n-BA-MPEGA-iC12-15A)-b-DMAPMA), 0.9 g o-Chlorobenzylchloride and 15 g of 1-methoxy-2-propanol. The mixture is heated to 95° C. for 4 h.

After the reaction, 30.9 g of liquid polymer are obtained; Mn=, PDI=

$^1$H-NMR indicates quantitative conversion for quaternization.

(n-BA-MPEGA-iC12-15A)-b-(DMAPMA-ClBnD-MAPMA)=(52-4-23)-(15-6).

Preparation of Poly(benzylmethacrylate-co-methacrylic Acid)—Binder:

24 g of benzyl-methacrylate, 6 g of methacrylic acid and 0.525 g of azobisisobutyronitrile (AIBN) are dissolved in 90 ml of propylene glycol 1-monomethyl ether 2-acetate (PG-MEA). The resulting reaction mixture is placed in a preheated oil bath at 80° C. After stirring for 5 hours at 80° C. under nitrogen, the resulting viscous solution is cooled to room temperature and used without further purification. The solid content is about 25%.

Preparation of Dispersion Films for Color Filter:

The following substances are placed into a 37 ml screw bottle:

| for PG36/PY150 system | |
|---|---|
| 2.0 g | pigment |
| 13.4 g | propylene glycol 1-monomethyl ether 2-acetate |
| 0.6 g | dispersant (solid) |
| 4.0 g | binder (25 wt % in PGMEA as mentioned above) |
| 50.0 g | zircon beads |
| for PB 15:6 system | |
| 1.0 g | pigment |
| 9.8 g | propylene glycol 1-monomethyl ether 2-acetate |
| 0.36 g | dispersant (solid) |
| 4.0 g | binder (25 wt % in PGMEA as mentioned above) |
| 0.04 g | Solsperse 5000 (Avecia Limited) |
| 50.0 g | zircon beads |
| for PR254 system | |
| 1.0 g | pigment |
| 8.6 g | propylene glycol 1-monomethyl ether 2-acetate |
| 0.2 g | dispersant (solid) |
| 3.2 g | binder (25 wt % in PGMEA as mentioned above) |
| 50.0 g | zircon beads |

Standard CF grade pigments used for the examples:
C.I. Pigment Green 36: Lionol Green 6YK, TOYO INK MFG Co. Ltd.
C.I. Pigment Yellow 150: Yellow E4GN-GT, Bayer AG
C.I. Pigment Blue 15:6: Lionol Blue E, TOYO INK MFG Co. Ltd.
C.I. Pigment Red 254: IRGAPHOR RED BT-CF, Ciba Specialty Chemicals Standard high molecular weight dispersants used for the examples:
Ciba EFKA 4300, 4330, 4047: Ciba Specialty Chemicals
Disperbyk 2000, 2001: Altana-BYK Chemie
Ajisper PB821: Ajinomoto Fine Techno The bottle is sealed with an inner cup and then applied to a paint conditioner for 3 hours to give the final dispersion. The dispersion thus obtained is cast onto a glass substrate by means of a spin coating, wherein a layer thickness is adjusted to give a film having a desired color points (by standard C light, observation 2 degree) by controlling rotation speed, then dried at 60° C. for 1 hour.

Optical properties of the dispersion films thus obtained are measured by use of a spectrophotometer (UV-2500PC, Shimadzu) and contrast measurement equipment (Model CT-1, Tsubosaka Electric Co., Ltd). The color points (C.I.E. 1931 x, y chromaticity diagram) are calculated using standard C light.

Viscosity measurements are performed by using a Brookfield Rheometer (Model DV-III) with a cone/plate set-up at 25° C.

For the particle size measurement dynamic light scattering (DLS) is used (Mircotrac UPA, Microtrac Inc., Nikkiso). For the measurement samples are diluted with PGMEA by factor of 100.

Developability of the dispersion films are tested by dipping to alkaline developer (Semi Clean DL-A4, Yokohama Oil & Fats Industry Co., LTD/water=1/9). Classify developability to 3 types. Dissolve, Dissolve then Peel, Peel. Dissolve type is suitable for color filter application.

TABLE 1

Performance data for a pigment system PG36(50%)/PY150(50%)

| sample details | | initial viscosity [mPa s] | | 1 week viscosity [mPa s] | | color property (y = 0.60) | | |
| --- | --- | --- | --- | --- | --- | --- | --- | --- |
| dispersant | solids [%] | 11.5 rpm | 115 rpm | 11.5 rpm | 115 rpm | x | Y | contrast |
| A27 | 50 | 17 | 12 | 25 | 19 | 0.304 | 58.6 | 4063 |
| A14 | 50 | 41 | 23 | 51 | 29 | 0.305 | 58.5 | 3997 |

TABLE 2

Developerbility for a pigment system PG36(50%)/PY150(50%)

| sample details | | |
| --- | --- | --- |
| dispersant | solids [%] | developerbility |
| A27 | 50 | Dissolve only |
| A14 | 50 | Dissolve then Peel |

In these examples, A27 related to this invention is compared to A14.

A27 gives lower initial viscosity, lower 1 week viscosity and higher contrast than A14.

In addition, A27 has the most suitable developerbility for color filter application.

TABLE 3

Performance data for a pigment system PB15:6

| sample details | | initial viscosity [mPa s] | | 1 week viscosity [mPa s] | | color property (y = 0.13) | | |
| --- | --- | --- | --- | --- | --- | --- | --- | --- |
| dispersant | solids [%] | 11.5 rpm | 115 rpm | 11.5 rpm | 115 rpm | x | Y | contrast |
| A36 | 50 | 17 | 10 | 2 | 8 | 0.135 | 17.0 | 4360 |
| A14 | 50 | 22 | 15 | 18 | 14 | 0.135 | 17.0 | 4270 |
| A14a | 50 | 60 | 10 | 7 | 10 | 0.135 | 17.0 | 4300 |

A14a: the polymer of Example A14 (Poly(n-BA-b-DMAPMA)) is 30% quaternized with 4-chlorobenzylchloride.

TABLE 4

Developerbility for a pigment system PB15:6

| sample details | | |
| --- | --- | --- |
| dispersant | solids [%] | developerbility |
| A36 | 50 | Dissolve only |
| A14a | 50 | Dissolve then Peel |

In these examples, A36 related to this invention is compared to A14 (Poly(n-BA-b-DMAPMA)) and to A14a which is the polymer of Example A14 (Poly(n-BA-b-DMAPMA)) 30% quaternized with 4-chlorobenzylchloride.

A36 gives lower initial viscosity, lower 1 week viscosity and higher contrast than A14, A14a In addition, A36 has the most suitable developerbility for color filter application.

TABLE 5

Performance data for a pigment system PG36(50%)/PY150(50%)

| sample details | | initial viscosity [mPa s] | | 1 week viscosity [mPa s] | | color property (y = 0.60) | | |
| --- | --- | --- | --- | --- | --- | --- | --- | --- |
| dispersant | solids [%] | 11.5 rpm | 115 rpm | 11.5 rpm | 115 rpm | x | Y | contrast |
| A27 | 50 | 17 | 12 | 25 | 19 | 0.304 | 58.6 | 4063 |
| Ajisper PB821 | 100 | 15 | 14 | 152 | 54 | 0.306 | 58.3 | 3570 |
| Disperbyk 2000 | 40 | 45 | 26 | 191 | 53 | 0.305 | 58.1 | 3783 |
| Disperbyk 2001 | 46 | 36 | 23 | 301 | 62 | 0.308 | 58.5 | 3822 |

TABLE 6

Developerbility for a pigment system PG36(50%)/PY150(50%)

| sample details | | |
|---|---|---|
| dispersant | solids [%] | developerbility |
| A27 | 50 | Dissolve only |
| Ajisper PB821 | 100 | Peel only |
| Disperbyk 2000 | 40 | no data |
| Disperbyk 2001 | 46 | Peel only |

In these examples, A27 related to this invention is compared to different commercial available dispersants which are used for color filter application.

A27 gives lower initial viscosity, lower 1 week viscosity and higher contrast than commercial available dispersants.

In addition, A27 has the most suitable developerbility for color filter application.

TABLE 7

Performance data for a pigment system PR 254

| sample details | | initial viscosity [mPa·s] | | particle size [μm] | |
|---|---|---|---|---|---|
| dispersant | solids [%] | 11.5 rpm | 115 rpm | D50 | D90 |
| Ciba EFKA-4047 | 35 | 139 | 36 | 0.25 | 0.34 |
| Ciba EFKA-4300 | 65 | 126 | 36 | 0.24 | 0.46 |
| Ciba EFKA-4330 | 65 | 100 | 34 | 0.24 | 0.35 |
| Example A2 | 60 | 134 | 55 | 0.15 | 0.25 |
| Comparative Example A3 | 60 | 104 | 44 | 0.15 | 0.24 |

In this example A3 related to this invention is compared to different commercial available dispersants. Example A3 gives smaller particle size, which is an indication for an improved dispersion containing primary particles only. A complete de-agglomeration is achieved.

The invention claimed is:

1. A method for producing a color filter, which comprises coating a substrate with a color filter composition, followed by exposure to effect photo-cure of the color filter composition, and development, wherein the color filter composition comprises
    a) a photoresist binder, wherein the photoresist binder is a (meth)acrylate/(meth)acrylic acid copolymer,
    b) a transparent pigment,
    c) optionally a solvent and/or optionally a photoinitiator or a photolatent catalyst,
    d) a dispersant which is a polymer or copolymer obtained by a process comprising the steps of
        a1) polymerizing in a first step one or more ethylenically unsaturated monomers in the presence of at least one nitroxylether having the structural element

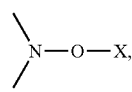

wherein X represents a group having at least one carbon atom and is such that the free radical X• derived from X is capable of initiating polymerization; or
        a2) polymerizing in a first step one or more ethylenically unsaturated monomers in the presence of at least one stable free nitroxyl radical

and a free radical initiator;
    wherein at least one monomer used in the steps a1) or a2) is a $C_1$-$C_6$ alkyl or hydroxyl $C_1$-$C_6$ alkyl ester of acrylic or methacrylic acid; and a second step
        b) comprising modification of the polymer or copolymer prepared under a1) or a2) by a transesterification reaction, an amidation, hydrolysis or anhydride modification or a combination thereof; and optionally in addition by quaternization.

2. A method according to claim 1, wherein the dispersant is a polymer or copolymer obtained by a process comprising the steps of a1) or a2) and a second step
    b) comprising the modification of the polymer or copolymer prepared under a1) or a2) by a transesterification reaction, an amidation, hydrolysis or anhydride modification or a combination thereof and in addition by quaternization.

3. A method according to claim 2 wherein the dispersant is obtained by a process wherein first polymerization step is carried out according to a1).

4. A method according to claim 2 wherein the dispersant is obtained by a process wherein second step b) is a transesterification reaction.

5. A method according to claim 1 wherein the dispersant is obtained by a process wherein first polymerization step is carried out according to a1).

6. A method according to claim 1 wherein the dispersant is obtained by a process wherein second step b) is a transesterification reaction.

7. A method according to claim 1 wherein the structural element

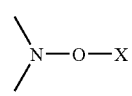

is a structural element of formula (I)

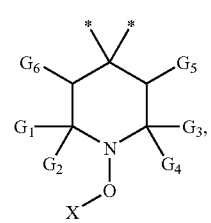

wherein $G_1$, $G_2$, $G_3$, $G_4$ are independently $C_1$-$C_6$alkyl or $G_1$ or $G_2$ or $G_3$ and $G_4$, or $G_1$ and $G_2$ and $G_3$ and $G_4$ together form a $C_5$-$C_{12}$cycloalkyl group;

$G_5$, $G_6$ independently are H, $C_1$-$C_{18}$alkyl, phenyl, naphthyl or a group $COOC_1$-$C_{18}$alkyl;

X is selected from the group consisting of —$CH_2$-phenyl, $CH_3CH$-phenyl, $(CH_3)_2$-phenyl, $(C_5$-$C_6$cycloalkyl$)_2$CCN, $(CH_3)_2$CCN,

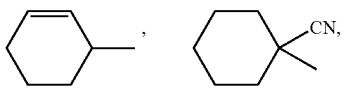

—CH$_2$CH=CH$_2$, CH$_3$CH—CH=CH$_2$ (C$_1$-C$_4$alkyl)CR$_{20}$—C(O)-phenyl, (C$_1$-C$_4$)alkyl-CR$_{20}$—C(O)—(C$_1$-C$_4$)alkoxy, (C$_1$-C$_4$)alkyl-CR$_{20}$—C(O)—(C$_1$-C$_4$)alkyl, (C$_1$-C$_4$)alkyl-CR$_{20}$—C(O)—N-di(C$_1$-C$_4$)alkyl, (C$_1$-C$_4$)alkyl-CR$_{20}$—C(O)—NH(C$_1$-C$_4$)alkyl and (C$_1$-C$_4$)alkyl-CR$_{20}$—C(O)—NH$_2$, wherein R$_{20}$ is hydrogen or (C$_1$-C$_4$)alkyl and * denotes a valence.

8. A method according to claim 7 wherein the structural element of formula (I) is a compound of formula (O1)

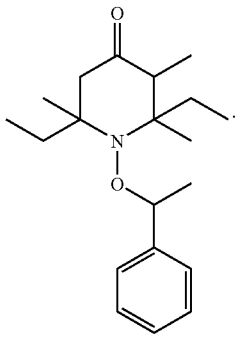

(O1)

9. A method according to claim 1 wherein the structural element

is a structural element of formula (II)

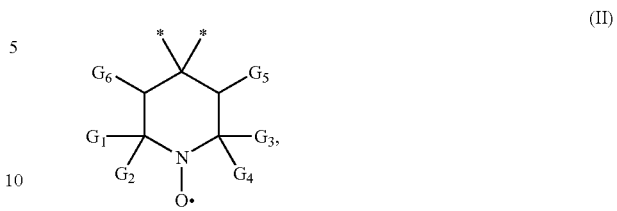

(II)

wherein
G$_1$, G$_2$, G$_3$, G$_4$ are independently C$_1$-C$_6$alkyl or G$_1$ and G$_2$ or G$_3$ and G$_4$, or G$_1$ and G$_2$ and G$_3$ and G$_4$ together form a C$_5$-C$_{12}$cycloalkyl group;
G$_5$, G$_6$ independently are H, C$_1$-C$_{18}$alkyl, phenyl, naphthyl or a group COOC$_1$-C$_{18}$alkyl; and
* denotes a valence.

10. A method according to claim 1 wherein the monomer in step a1 or a2 is selected from isoprene, 1,3-butadiene, α-C$_5$-C$_{18}$alkene, 4-vinyl-pyridine, 4-vinyl-pyridinium-ion, 2-vinyl-pyridine, 2-vinyl-pyridinium-ion, vinyl-imidazole, vinyl-imidazolinium-ion, dimethylacrylamide, 3-dimethylaminopropylmethacrylamide, styrene, α-methyl styrene, p-methyl styrene, p-tert-butyl-styrene and a compound of formula CH$_2$=C(R$_a$)—(C=Z)—R$_b$, wherein R$_a$ is hydrogen or methyl, R$_b$ is NH$_2$, O$^-$(Me$^+$), unsubstituted C$_1$-C$_{18}$alkoxy, C$_2$-C$_{100}$alkoxy interrupted by at least one N and/or O atom, or hydroxy-substituted C$_1$-C$_{18}$alkoxy, unsubstituted C$_1$-di(C$_1$-C$_{18}$alkyl)amino, —O—CH$_2$—CH$_2$—N(CH$_3$)$_2$ or —O—CH$_2$—CH$_2$—N$^+$H(CH$_3$)$_2$An$^-$;
An$^-$ is a anion of a monovalent organic or inorganic acid;
Me is a monovalent metal atom or the ammonium ion and Z is oxygen or sulfur.

11. A method according to claim 1 wherein the dispersant is obtained by a process wherein in step b an alcohol for the transesterification reaction is an unsubstituted linear or branched C$_8$-C$_{36}$alkyl mono alcohol or mixtures thereof or a mono alcohol derived from ethylenoxide, propylenoxide or mixtures thereof with up to 100 C atoms.

* * * * *